(12) United States Patent
Kuo et al.

(10) Patent No.: US 11,183,587 B2
(45) Date of Patent: Nov. 23, 2021

(54) BIPOLAR JUNCTION TRANSISTOR (BJT) COMPRISING A MULTILAYER BASE DIELECTRIC FILM

(71) Applicant: Taiwan Semiconductor Manufacturing Co., Ltd., Hsin-Chu (TW)

(72) Inventors: Chun-Tsung Kuo, Tainan (TW); Jiech-Fun Lu, Madou Township (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/924,545

(22) Filed: Jul. 9, 2020

(65) Prior Publication Data

US 2021/0134988 A1    May 6, 2021

Related U.S. Application Data

(60) Provisional application No. 62/928,579, filed on Oct. 31, 2019.

(51) Int. Cl.
  *H01L 29/737* (2006.01)
  *H01L 29/66* (2006.01)
  (Continued)

(52) U.S. Cl.
  CPC ........ *H01L 29/7378* (2013.01); *H01L 21/022* (2013.01); *H01L 21/0337* (2013.01);
  (Continued)

(58) Field of Classification Search
  CPC ........... H01L 29/7378; H01L 29/66242; H01L 29/165; H01L 21/31122; H01L 21/022;
  (Continued)

(56) References Cited

U.S. PATENT DOCUMENTS 5,504,018 A * 4/1996 Sato ................. H01L 29/66242
                                                         438/350
5,698,890 A * 12/1997 Sato ................. H01L 29/66242
                                                         257/592

(Continued)

OTHER PUBLICATIONS

Bryant, James. "Choosing Discrete Transistors." MyAnalog.com Published on May 19, 2014.

(Continued)

*Primary Examiner* — Syed I Gheyas
(74) *Attorney, Agent, or Firm* — Eschweiler & Potashnik, LLC

(57) ABSTRACT

Various embodiments of the present disclosure are directed towards a method for forming a bipolar junction transistor (BJT). A dielectric film is deposited over a substrate and comprises a lower dielectric layer, an upper dielectric layer, and an intermediate dielectric layer between the lower and upper dielectric layers. A first semiconductor layer is deposited over the dielectric film and is subsequently patterned to form an opening exposing the dielectric film. A first etch is performed into the upper dielectric layer through the opening to extend the opening to the intermediate dielectric layer. Further, the first etch stops on the intermediate dielectric layer and laterally undercuts the first semiconductor layer.

(Continued)

Additional etches are performed to extend the opening to the substrate. A lower base structure and an emitter are formed stacked in and filling the opening, and the first semiconductor layer is patterned to form an upper base structure.

20 Claims, 22 Drawing Sheets

(51) Int. Cl.
*H01L 29/165* (2006.01)
*H01L 21/311* (2006.01)
*H01L 21/02* (2006.01)
*H01L 29/08* (2006.01)
*H01L 21/033* (2006.01)
*H01L 29/10* (2006.01)

(52) U.S. Cl.
CPC .... *H01L 21/31122* (2013.01); *H01L 29/0817* (2013.01); *H01L 29/0821* (2013.01); *H01L 29/1004* (2013.01); *H01L 29/165* (2013.01); *H01L 29/66242* (2013.01)

(58) Field of Classification Search
CPC ............. H01L 29/0821; H01L 29/0817; H01L 21/0337; H01L 29/1004; H01L 29/0692; H01L 29/0649; H01L 29/7371
See application file for complete search history.

(56) References Cited

U.S. PATENT DOCUMENTS

| | | | | |
|---|---|---|---|---|
| 9,786,770 | B1* | 10/2017 | John | H01L 21/31111 |
| 2003/0178700 | A1* | 9/2003 | Franosch | H01L 29/1004 |
| | | | | 257/565 |
| 2017/0236923 | A1* | 8/2017 | Chevalier | H01L 29/1004 |
| | | | | 257/578 |
| 2018/0286968 | A1* | 10/2018 | Jain | H01L 29/66272 |

OTHER PUBLICATIONS

Institute of Electronics and Photonics. "4 Electrical properties of HEMT." The date of publication is unknown. Retrieved online on Jun. 11, 2020 from http://uef.fei.stuba.sk/moodle/mod/book/view.php?id=79208chapterid=64%201/2.

Schwierz et al. "Semiconductor Devices for RF Applications: Evolution and Current Status." Microelectronics Reliability vol. 41, Issue 2, pp. 145-168, published Feb. 2001.

* cited by examiner

US 11,183,587 B2

BIPOLAR JUNCTION TRANSISTOR (BJT) COMPRISING A MULTILAYER BASE DIELECTRIC FILM

REFERENCE TO RELATED APPLICATION

This application claims the benefit of U.S. Provisional Application No. 62/928,579, filed on Oct. 31, 2019, the contents of which are incorporated herein by reference in their entirety.

BACKGROUND

Bipolar junction transistors (BJTs) are commonly used in digital and analog integrated circuit (IC) devices for high frequency applications. A BJT includes two p-n junctions sharing a cathode or anode region called a base. The base separates two regions respectively called an emitter and a collector. The emitter and the collector have the same doping type as each other and have an opposite doping type as the base. Depending on the doping types of the base, collector, and emitter, a BJT may be an NPN BJT or a PNP BJT.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
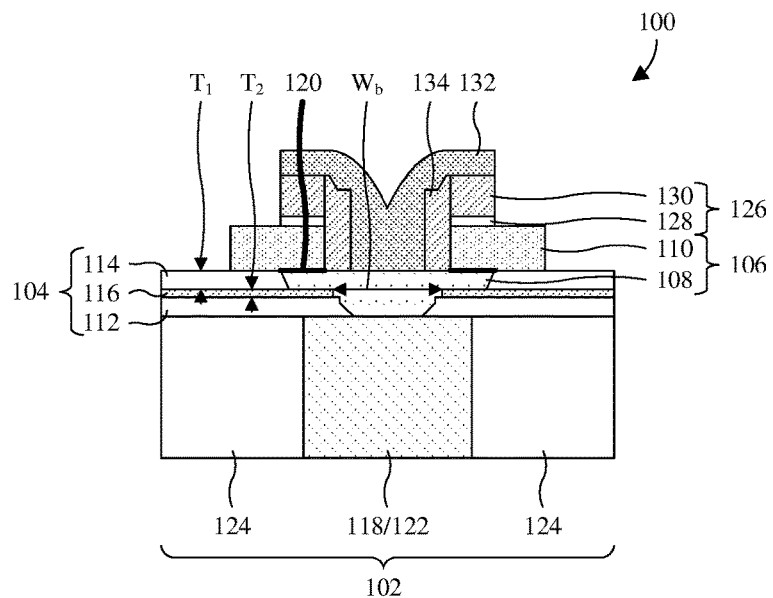
FIG. 1 illustrates a cross-sectional view of some embodiments of a bipolar junction transistor (BJT) comprising a multilayer base dielectric film.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some methods for forming a bipolar junction transistor (BJT) comprise: depositing an oxide layer over a substrate; depositing a base polysilicon layer over the oxide layer; patterning the base polysilicon layer to form an opening exposing the oxide layer and overlying a doped region in the substrate that defines a collector; forming a sidewall spacer structure on a sidewall of the base polysilicon layer in the opening; performing an etch vertically and laterally into the oxide layer through the opening to extend the opening to the collector and to extend the opening under the base polysilicon layer; depositing a silicon germanium base at a bottom of the opening; depositing an emitter polysilicon layer filling a remainder of the opening over the silicon germanium base; and patterning the base polysilicon layer and the base emitter layer to respectively form a polysilicon base and an emitter. The polysilicon base and the silicon germanium base directly contact and collectively define a base.

A challenge with the method is that a contact area between the polysilicon base and the silicon germanium base is small and hence a contact resistance between the polysilicon base and the silicon germanium base is high. The contact resistance partially defines the overall resistance of the base. For example, the resistance of the base (e.g., Rb) may be the sum of the contact resistance, the resistance of the polysilicon base, and the resistance of the silicon germanium base. Hence, the resistance of the base is also high. The high base resistance leads to low current and hence high transit time. The high transit time limits the transition frequency (e.g., Ft) and the maximum oscillation frequency (e.g., Fmax). Hence, the high transit time limits performance of the BJT. The maximum oscillation frequency may, for example, be the frequency at which power gain is one (e.g., unity). The transition frequency may, for example, be the frequency at which short-circuit current gain is one (e.g., unity).

Various embodiments of the present disclosure are directed towards a method for forming a BJT comprising a multilayer base dielectric film, as well as the BJT resulting from the method. In some embodiments of the method, the multilayer base dielectric film is deposited over a substrate and comprises a lower dielectric layer, an upper dielectric layer, and an intermediate dielectric layer between the lower and upper dielectric layers. A first semiconductor layer is deposited over the multilayer base dielectric film and is subsequently patterned to form an opening exposing the multilayer base dielectric film. A first etch is performed into the upper dielectric layer through the opening to extend the opening to the intermediate dielectric layer. Further, the first etch stops on the intermediate dielectric layer and laterally undercuts the first semiconductor layer. Additional etches are performed to extend the opening to the substrate. A lower base structure and an emitter are formed stacked in and filling the opening with the emitter overlying the lower base structure. Further, the first semiconductor layer is patterned to form an upper base structure directly contacting the lower base structure. The lower and upper base structures are semiconductors with different bandgaps and directly contact where the first semiconductor layer is undercut by the first etch.

Because the intermediate dielectric layer serves as an etch stop during the first etch, and because the first etch laterally undercuts the first semiconductor layer, the first etch may extend under the first semiconductor layer to a large degree and the contact area between the lower and upper base structures may be large. Because the contact area may be large, the contact resistance between the lower and upper base structures (e.g., a resistance at the contact area) may be small. As such, an overall resistance of a base collectively defined by the lower and upper base structures may be small. Because the resistance of the base may be small, current through the BJT may be large and hence the transit time of the BJT may be small. Because of the large current and the small transit time, the transition frequency of the BJT and the maximum oscillation frequency of the BJT may be large. Because the contact area is enlarged by a series of depositions (e.g., for the multilayer base dielectric film) and a series of etches (e.g., the first etch and the additional etches), the contact area may be enlarged at relatively low complexity and at relatively low cost.

With reference to FIG. 1, a cross-sectional view 100 of some embodiments of a BJT 102 comprising a multilayer base dielectric film 104 is provided. As seen hereafter, the multilayer base dielectric film 104 may facilitate formation of a base 106 with a low resistance. As a result, the transition frequency (e.g., Ft) of the BJT 102 and the maximum oscillation frequency (e.g., Fmax) of the BJT 102 may be high. The BJT 102 may, for example, be a heterojunction BJT (HBT) or some other suitable type of BJT. Applications of the BJT 102 may, for example, include space-based radar, automation radar, and high-speed short-range wireless communication. Other suitable applications are, however, amenable.

The multilayer base dielectric film 104 accommodates a lower base structure 108 and underlies an upper base structure 110. Collectively, the lower base structure 108 and the upper base structure 110 define the base 106. Further, the multilayer base dielectric film 104 comprises a lower base dielectric layer 112, an upper base dielectric layer 114, and an intermediate base dielectric layer 116. The lower and upper base dielectric layers 112, 114 respectively underlie and overlie the intermediate base dielectric layer 116, such that the intermediate base dielectric layer 116 is buried in the multilayer base dielectric film 104. Further, the lower and upper base dielectric layers 112, 114 are different dielectrics than the intermediate base dielectric layer 116 and, in some embodiments, are the same dielectric.

The lower and upper base dielectric layers 112, 114 may, for example, be or comprise silicon oxide, silicon oxynitride, some other suitable dielectric(s), or any combination of the foregoing. The intermediate base dielectric layer 116 may, for example, be or comprise silicon nitride, silicon oxynitride, silicon carbide, some other suitable dielectric(s), or any combination of the foregoing. In some embodiments, the lower and upper base dielectric layers 112, 114 are silicon oxide, whereas the intermediate base dielectric layer 116 is silicon nitride, such that the multilayer base dielectric film 104 is an ONO dielectric film.

The lower base structure 108 is inset into the multilayer base dielectric film 104 and overlies the intermediate base dielectric layer 116 and the lower base dielectric layer 112 at a periphery of the lower base structure 108. Further, the lower base structure 108 protrudes through the intermediate base dielectric layer 116 and the lower base dielectric layer 112 to a collector 118 at a center of the lower base structure 108. Hence, a width $W_b$ of the lower base structure 108 decreases discretely from top to bottom and may, for example, have a T-shaped profile or some other suitable profile. Because the width $W_b$ decreases discretely from top to bottom, less of the collector 118 may be exposed to etchants and/or an ambient environment during formation of an opening within which the lower base structure 108 is formed. As such, damage to the collector 118 may be reduced and leakage current may be reduced. Hence, performance of the BJT 102 may be enhanced.

In some embodiments, a top surface of the lower base structure 108 is even or about even with a top surface of the multilayer base dielectric film 104 and/or a bottom surface of the lower base structure 108 is even or about even with a bottom surface of the multilayer base dielectric film 104. Further, in some embodiments, a thickness of the lower base structure 108 is the same as or about the same as a thickness of the multilayer base dielectric film 104.

The upper base structure 110 overlies the multilayer base dielectric film 104 and the lower base structure 108. Further, the upper base structure 110 directly contacts the lower base structure 108 at a contact area 120. As illustrated and explained in detail hereafter, the contact area 120 may be large because of the multiple layers of the multilayer base dielectric film 104 and a method by which the BJT 102 may be formed. The method may, for example, comprise: 1) depositing a semiconductor layer over the multilayer base dielectric film 104; 2) patterning the semiconductor layer to form an opening exposing the multilayer base dielectric film 104; 3) performing a first etch vertically and laterally into the upper base dielectric layer 114 while the intermediate base dielectric layer 116 serves as an etch stop; 4) performing additional etches to extend the opening to the collector 118; 5) depositing the lower base structure 108 at a bottom of the opening; and 6) patterning the semiconductor layer to form the upper base structure 110. Other suitable methods for forming the BJT 102 are, however, amenable.

Because the intermediate base dielectric layer 116 serves as an etch stop during the first etch, and because the first etch extends laterally into the upper base dielectric layer 114, the etch may extend under the semiconductor layer to a large degree. Because the upper base structure 110 is formed from the semiconductor layer, and because the lower base structure 108 is deposited at the bottom of the opening, the lower base structure 108 may extend under the upper base structure 110 to a large degree. Hence, the contact area 120 may be large.

Because the contact area 120 may be large, the contact resistance between the lower and upper base structures 108, 110 (e.g., a resistance at the contact area 120) may be small. As such, an overall resistance of the base 106 may be small. Because the resistance of the base 106 may be small, current through the BJT 102 may be large and hence the transit time of the BJT 102 may be small. Because of the large current and the small transit time, the transition frequency (e.g., Ft) and the maximum oscillation frequency (e.g., Fmax) may be high. For example, when the BJT 102 is an NPN-type BJT, the transition frequency may be greater than about 240 gigahertz (GHz) or some other suitable value and/or the maximum oscillation frequency may be greater than about 400 GHz or some other suitable value. As another example, when the BJT 102 is an PNP-type BJT, the transition frequency may be greater than about 100 GHz or other suitable value and/or the maximum oscillation frequency may be greater than about 160 GHz or some other suitable value. The maximum oscillation frequency may, for example, be the frequency at which power gain is one (e.g., unity). The transition frequency may, for example, be the frequency at which short-circuit current gain is one (e.g., unity).

The lower and upper base structures 108, 110 are semiconductor materials with different bandgaps. For example, the lower base structure 108 may have a lower bandgap than the upper base structure 110. Because the lower and upper base structures 108, 110 are semiconductor materials with different bandgaps, the lower and upper base structures 108, 110 define a heterojunction at the contact area 120. The lower and upper base structures 108, 110 further share a common doping type (e.g., P-type or N-type). The lower base structure 108 may, for example, be or comprise doped silicon germanium and/or some other suitable semiconductor material, and/or the upper base structure 110 may, for example, be or comprise doped polysilicon and/or some other suitable semiconductor material. In some embodiments in which the lower base structure 108 is or comprises germanium, the upper base structure 110 consists of or consists essentially of silicon.

The collector 118 underlies the multilayer base dielectric film 104 and the lower base structure 108. Further, the collector 118 directly contacts the lower base structure 108 and, in some embodiments, the multilayer base dielectric film 104. The collector 118 is a doped region of a semiconductor substrate 122 that is surrounded by a trench isolation structure 124. Further, the collector 118 has an opposite doping type as the base 106. For example, the collector 118 may be P-type, whereas the base 106 may be N-type, or vice versa.

The trench isolation structure 124 underlies the multilayer base dielectric film 104 and extends into the semiconductor substrate 122 to surround and demarcate the collector 118. The trench isolation structure 124 may, for example, be or comprise silicon oxide and/or some other suitable dielectric(s). Further, the trench isolation structure 124 may, for example, be a shallow trench isolation (STI) structure, a deep trench isolation (DTI) structure, or some other suitable type of trench isolation structure.

The semiconductor substrate 122 has a different bandgap than the lower base structure 108 at an interface at which the collector 118 and the lower base structure 108 directly contact. For example, the semiconductor substrate 122 may have a higher bandgap than the lower base structure 108 at the interface. Because the semiconductor substrate 122 and the lower base structure 108 have different bandgaps at the interface, the semiconductor substrate 122 and the lower base structure 108 define a heterojunction at the interface. The semiconductor substrate 122 may, for example, be or comprise monocrystalline silicon and/or some other suitable semiconductor material, and/or the lower base structure 108 may, for example, be or comprise silicon germanium and/or some other suitable semiconductor material.

In some embodiments, the semiconductor substrate 122 is a bulk semiconductor substrate, a semiconductor-on-insulator (SOI) substrate, or some other suitable type of substrate. In some embodiments, the semiconductor substrate 122 and the upper base structure 110 share a common semiconductor element. For example, the semiconductor substrate 122 may be or comprise monocrystalline silicon, whereas the upper base structure 110 may be or comprise polycrystalline silicon, such that the semiconductor substrate 122 and the upper base structure 110 share silicon. In some embodiments, the semiconductor substrate 122 and the upper base structure 110 respectively have a monocrystalline lattice and a polycrystalline lattice.

A hard mask 126 overlies the upper base structure 110 and comprises a lower hard mask layer 128 and an upper hard mask layer 130. In alternative embodiments, the lower hard mask layer 128 and/or the upper hard mask layer 130 is/are omitted. The lower and upper hard mask layers 128, 130 are vertically stacked with the upper hard mask layer 130 overlying the lower hard mask layer 128. Further, the lower and upper hard mask layers 128, 130 are different dielectrics. For example, the lower hard mask layer 128 may be or comprise silicon oxide, whereas the upper hard mask layer 130 may be or comprise silicon nitride. Other suitable dielectrics are, however, amenable. In some embodiments, the lower hard mask layer 128 is or comprises the same dielectric material as the lower base dielectric layer 112 and/or the upper base dielectric layer 114. Further, in some embodiments, the upper hard mask layer 130 is or comprises the same dielectric material as the intermediate base dielectric layer 116.

An emitter 132 overlies the hard mask 126 and extends downward through the hard mask 126 and the upper base structure 110 to direct contact with the lower base structure 108. The emitter 132 is or comprise a doped semiconductor material having an opposite doping type as the base 106 and/or the same doping type as the collector 118. For example, the emitter 132 may be P-type, whereas the base 106 may be N-type, or vice versa. Further, the emitter 132 has a bandgap that is different than that of the lower base structure 108. As such, the emitter 132 and the lower base structure 108 define a heterojunction at an interface at which the emitter 132 and the lower base structure 108 directly contact. In some embodiments, the emitter 132 has a higher bandgap than the lower base structure 108. Further, in some embodiments, the emitter 132 has the same bandgap as the upper base structure 110. The emitter 132 may, for example, be or comprise polycrystalline silicon and/or some other suitable semiconductor material.

In some embodiments, the emitter 132 and the upper base structure 110 are the same semiconductor material. For example, the emitter 132 and the upper base structure 110 may both be doped polysilicon. In some embodiments, the emitter 132 and the semiconductor substrate 122 share a common semiconductor element. For example, the emitter 132 may be or comprise polycrystalline silicon, whereas the semiconductor substrate 122 may be or comprise monocrystalline silicon. In some embodiments, the emitter 132 and the semiconductor substrate 122 respectively have a polycrystalline lattice and monocrystalline lattice.

A sidewall spacer structure 134 laterally separates the emitter 132 from the hard mask 126 and the upper base structure 110. The sidewall spacer structure 134 may be or comprise silicon nitride and/or some other suitable dielectric material. In some embodiments, the sidewall spacer structure 134 is or comprises the same dielectric material as the upper hard mask layer 130 and/or as the intermediate base dielectric layer 116.

In some embodiments, the lower and upper base dielectric layers 112, 114 have individual first thicknesses $T_1$ that are about 160 angstroms, about 100-115 angstroms, about 100-160 angstroms, about 40-100 angstroms, or some other suitable value. In some embodiments, the intermediate base dielectric layer 116 has a second thickness $T_2$ that is about 30 angstroms, about 50 angstroms, about 10-50 angstroms, about 25-75 angstroms, or some other suitable value. If the first thicknesses $T_1$ and/or the second thickness $T_2$ is/are too large (e.g., above the above ranges and/or values), the lower base structure 108 may be too thick and hence the base 106 may have a high resistance. The high resistance may, in turn, negatively impact the transition frequency of the BJT 102, the maximum oscillation frequency of the BJT 102, and other suitable parameters of the BJT 102. If the first thicknesses $T_1$ and/or the second thickness $T_2$ is/are too small (e.g., below the above ranges and/or values), the lower base structure 108 and the multilayer base dielectric film 104 may be too thin and hence leakage current may be high. This may, in turn, negatively impact performance of the BJT 102. Further, if the second thickness $T_2$ is too small (e.g., less than about 10 angstroms or some other suitable value), the intermediate base dielectric layer 116 may be too thin to serve as an etch stop while forming the lower base structure 108. As such, control over an opening within which the lower base structure 108 is formed may be poor. This may, in turn, lead to damage to the collector 118 and/or may lead to the contact area 120 being small.

Figures 2A, 2B:
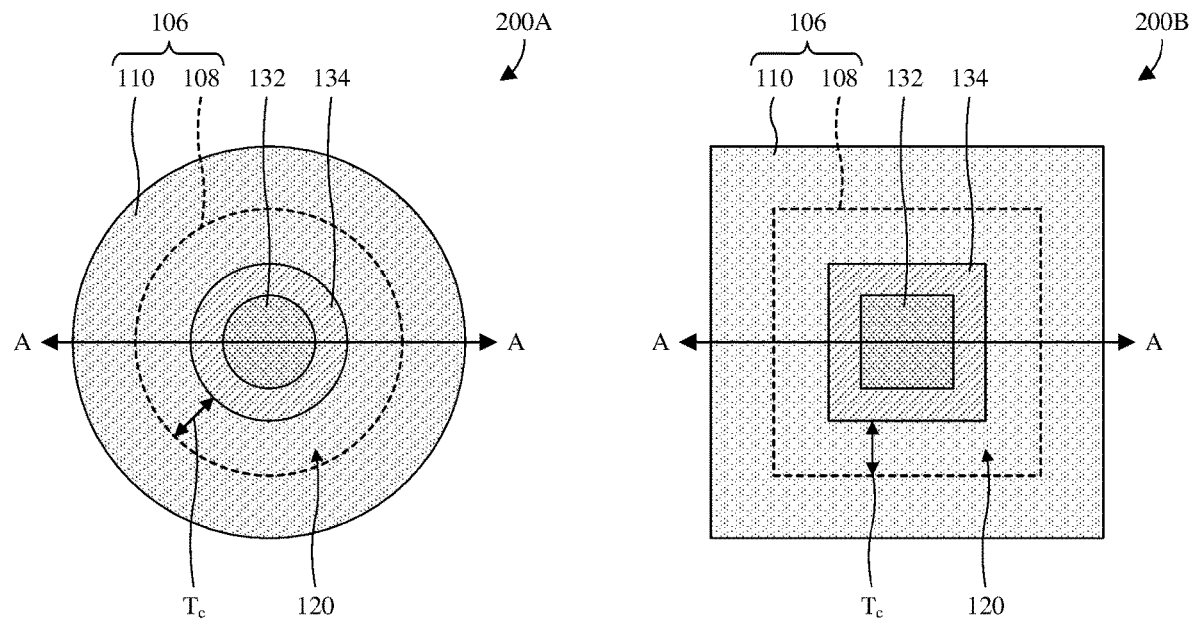
FIGS. 2A and 2B illustrate top layout views of some different embodiments of the BJT of FIG. 1.

With reference to FIGS. 2A and 2B, top layout views 200A and 200B of some different embodiments of the BJT 102 of FIG. 1 are provided. The cross-sectional view 100 of FIG. 1 may, for example, be taken along line A in any of FIGS. 2A and 2B. The sidewall spacer structure 134 extends in a first closed path to surround the emitter 132, and the upper base structure 110 extends in a second closed path to surround the sidewall spacer structure 134. In FIG. 2A, the sidewall spacer structure 134 and the upper base structure 110 are circular ring shaped. In FIG. 2B, the sidewall spacer structure 134 and the upper base structure 110 are square ring shaped. In other embodiments, other suitable shapes are amenable.

An outer boundary of the lower base structure 108 is shown in phantom, and the contact area 120 is between the outer boundary of the lower base structure 108 and the sidewall spacer structures. In FIG. 2A, the outer boundary of the lower base structure 108 is circular, such that the contact area 120 is circular ring shaped. In FIG. 2B, the outer boundary of the lower base structure 108 is square, such that the contact area 120 is square ring shaped. In other embodiments, other suitable shapes are amenable.

In some embodiments, a thickness $T_c$ of the contact area 120 is about 10-50 nanometers, about 10-30 nanometers, about 30-50 nanometers, or some other suitable amount. If the thickness Tc is too small (e.g., less than about 10 nanometers or some other suitable value), the contact area 120 may be small and hence a contact resistance between the lower base structure 108 and the upper base structure 110 may be high. As a result, an overall resistance of the base 106 may be high and hence performance of the BJT 102 may be poor. For example, the transition frequency and/or the maximum oscillation frequency may be low. If the thickness $T_c$ is too large (e.g., greater than about 50 nanometers or some other suitable value), a semiconductor layer from which the upper base structure 110 is formed may collapse into an opening within which the lower base structure 108 is formed.

With reference to FIGS. 3A-3E, cross-sectional views 300A-300E of some different alternative embodiments of the BJT 102 of FIG. 1 are provided.

Figure 3A:
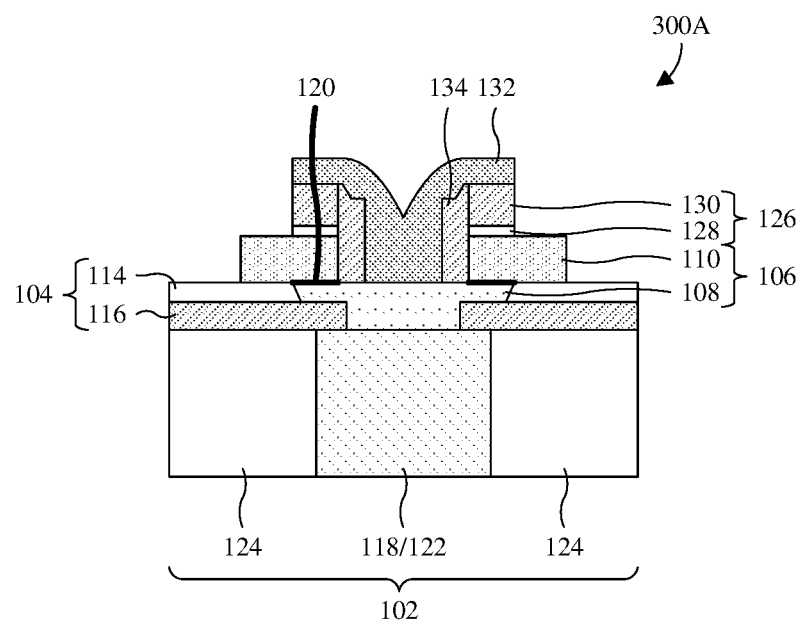
FIGS. 3A-3E illustrate cross-sectional views of some different alternative embodiments of the BJT of FIG. 1.

In FIG. 3A, the lower base dielectric layer 112 is omitted, such the multilayer base dielectric film 104 has two layers instead of three. Further, the intermediate base dielectric layer 116 is more aptly referred to as the lower base dielectric layer. By omitting the lower base dielectric layer 112, material costs may be reduced. In alternative embodiments, the multilayer base dielectric film may include four or more base dielectric layers.

Figure 3B:
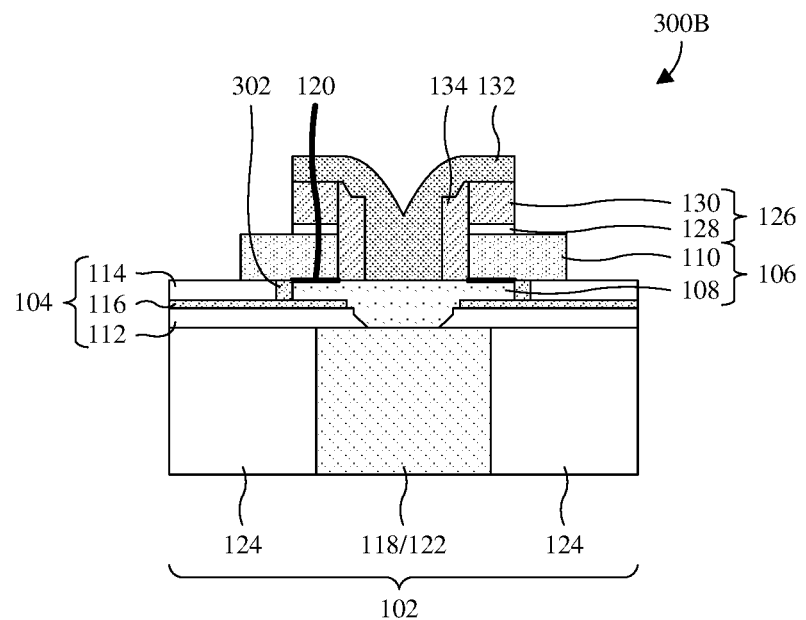

In FIG. 3B, a lateral etch stop layer 302 underlies the upper base structure 110 and extends into the upper base dielectric layer 114 to the intermediate base dielectric layer 116. The lateral etch stop layer 302 is a different dielectric than the lower and upper base dielectric layers 112, 114 and may, for example, be or comprise silicon nitride, silicon carbide, silicon oxynitride, or some other suitable dielectric. In some embodiments, the lateral etch stop layer 302 is or comprises silicon nitride, whereas the lower and upper base dielectric layers 112, 114 are or comprise silicon oxide, or vice versa. In some embodiments, the lateral etch stop layer 302 is or comprises the same dielectric as the intermediate base dielectric layer 116.

The lateral etch stop layer 302 may be localized with a high degree of control using photolithography. For example, a process for forming the lateral etch stop layer 302 may comprise: 1) patterning the upper base dielectric layer 114 to form an opening for the lateral etch stop layer 302 using photolithography; 2) depositing the lateral etch stop layer 302 covering the upper base dielectric layer 114 and filling the opening; and 3) etching back the lateral etch stop layer 302. Other suitable processes are, however, amenable. Because the lateral etch stop layer 302 may be localized with a high degree of control, the lateral etch stop layer 302 may increase control over the contact area 120. For example, as illustrated in detail hereafter, formation of the lower base structure 108 may comprise laterally etching the upper base dielectric layer 114 under a semiconductor layer from which the upper base structure 110 is formed. The lateral etch stop layer 302 may provide an etch stop for this lateral etching to increase control over the extent of the lateral etching, which increases control over the contact area 120.

Figure 3C:
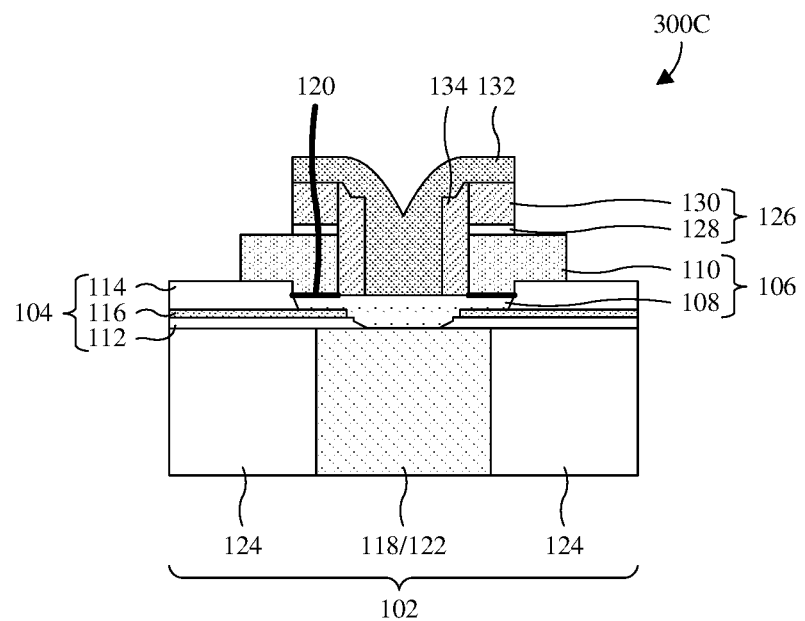

In FIG. 3C, the upper base structure 110 wraps around a top corner of the upper base dielectric layer 114. Further, the upper base dielectric layer 114 has an increased thickness compared to the lower base dielectric layer 112. In alternative embodiments, the lower and upper base dielectric layers 112, 114 have the same thickness. In alternative embodiments, the lower base dielectric layer 112 has an increased thickness compared to the upper base dielectric layer 114.

Figure 3D:
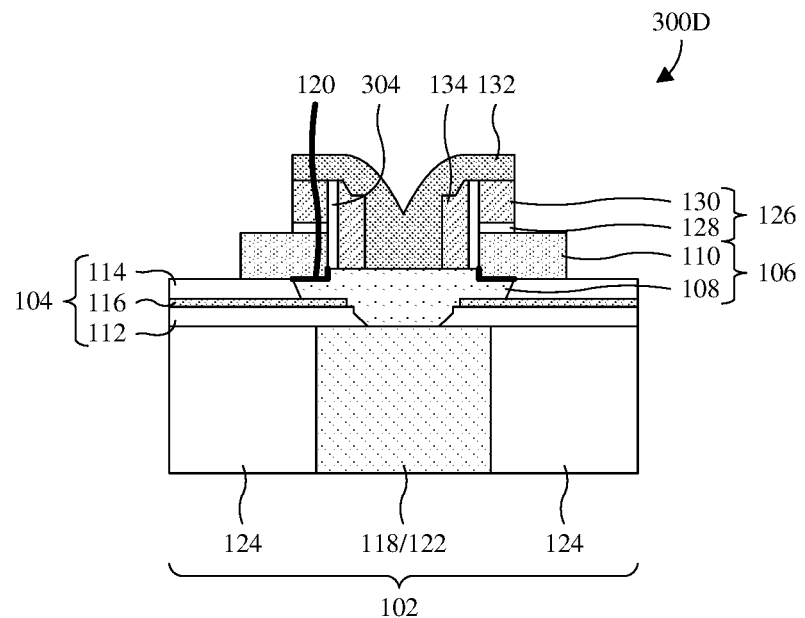

In FIG. 3D, the lower base structure 108 directly contacts the upper base structure 110 at both a bottom surface of the upper base structure 110 and a sidewall of the upper base structure 110. As such, the contact area 120 between the lower and upper base structures 108, 110 wraps around a bottom corner of the upper base structure 110 and may be larger than if it was localized to the bottom surface of the upper base structure 110. Because the contact area 120 may be larger, the contact resistance between the lower and upper base structures 108, 110 may be lower and hence an overall resistance of the base 106 may be lower. This, in turn, may enhance the transition frequency of the BJT 102, the maximum oscillation frequency of the BJT 102, and other suitable parameters of the BJT 102.

A liner layer 304 separates the sidewall spacer structure 134 from the hard mask 126 and the upper base structure 110. The liner layer 304 is a different dielectric than the intermediate base dielectric layer 116 and may, for example, be or comprise silicon oxide and/or some other suitable dielectric(s). In some embodiments, the liner layer 304 is or comprises silicon oxide, whereas the intermediate base dielectric layer 116 is or comprises silicon nitride, or vice versa. In some embodiments, the liner layer 304 is or comprises the same dielectric as the lower base dielectric layer 112 and/or the upper base dielectric layer 114.

During formation of the BJT 102, the liner layer 304 may have a lateral segment extending along a bottom surface of the sidewall spacer structure 134 from a sidewall of a semiconductor layer from which the upper base structure 110 is formed. Further, during formation of the BJT 102, the liner layer 304 and the upper base dielectric layer 114 may be vertically and laterally etched to form an opening within which the lower base structure 108 is deposited. The lateral etching may remove the lateral segment, such that the opening exposes the sidewall of the semiconductor layer. Further, the lateral etching may extend the opening under the semiconductor layer. Because the lower base structure 108 is deposited in the opening, and the upper base structure 110 is formed from the semiconductor layer, forming the opening as above may lead to formation of the lower base structure 108 on both a bottom surface of the upper base structure 110 and a sidewall of the upper base structure 110.

Figure 3E:
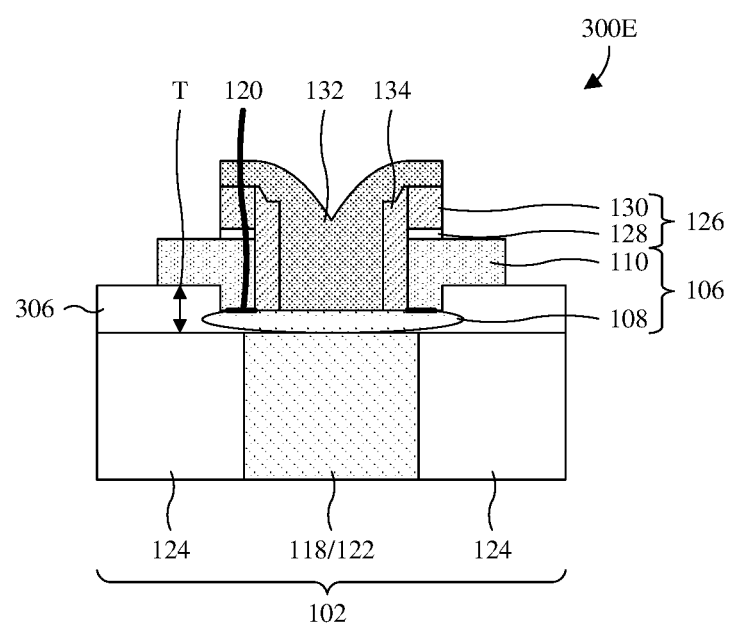

In FIG. 3E, the multilayer base dielectric film 104 is replaced by a base dielectric layer 306 and the upper base structure 110 wraps around a top corner of the base dielectric layer 306 from a top surface of the base dielectric layer 306 to a sidewall of the base dielectric layer 306. Further, the lower base structure 108 is oblong with a curved profile similar to an oval. Other suitable profiles are, however, amenable in alternative embodiments.

As illustrated in detail hereafter, the contact area 120 may be large because the upper base structure 110 wraps around the top corner of the base dielectric layer 306 and because of a method by which the BJT 102 may be formed. The method may, for example, comprise: 1) patterning the base dielectric layer 306 to form a recess along a top of the base dielectric layer 306; 2) depositing a semiconductor layer covering the base dielectric layer 306 and lining the recess; 3) patterning the semiconductor layer to form an opening exposing the base dielectric layer 306; 4) performing an etch vertically and laterally into the base dielectric layer 306 to extend the opening vertically to the semiconductor substrate 122 and to extend the opening laterally under the semiconductor layer; 5) depositing the lower base structure 108 at a bottom of the opening; and 6) patterning the semiconductor layer to form the upper base structure 110. Other suitable methods for forming the BJT 102 are, however, amenable.

Because of the recess, a separation between a bottom surface of the semiconductor layer and the semiconductor substrate 122 is reduced. It has been appreciated that by reducing the separation, the etch more efficiently clears the base dielectric layer 306 from the bottom surface of the semiconductor layer. As such, more of the bottom surface is exposed in the opening than would otherwise be. Because more of the bottom surface is exposed, the contact area 120 is larger when the lower base structure 108 is deposited in the opening. Because of the larger contact area 120, a contact resistance between the lower and upper base structures 108, 110 is lower and an overall resistance of the base 106 is lower. This, in turn, enhances the transition frequency of the BJT 102, the maximum oscillation frequency of the BJT 102, and other suitable parameters of the BJT 102.

The base dielectric layer 306 may, for example, be or comprise silicon oxide, silicon oxynitride, some other suitable dielectric(s), or any combination of the foregoing. In some embodiments, the base dielectric layer 306 is as the lower base dielectric layer 112 and/or the upper base dielectric layer 114 is/are described. In some embodiments, a thickness T of the base dielectric layer 306 is about 250-400 angstroms, about 250-325 angstroms, about 325-400 angstroms, about 350 angstroms, or some other suitable value. If the thickness T is too small (e.g., less than about 250 angstroms or some other suitable value), leakage current may be high. This may, in turn, negatively impact performance of the BJT 102. If the thickness T is too large (e.g., more than about 400 angstroms or some other suitable value), the lower base structure 108 may be too thick and hence the base 106 may have a high resistance. The high resistance may, in turn, negatively impact the transition frequency of the BJT 102, the maximum oscillation frequency of the BJT 102, and other suitable parameters of the BJT 102.

Figure 4A:
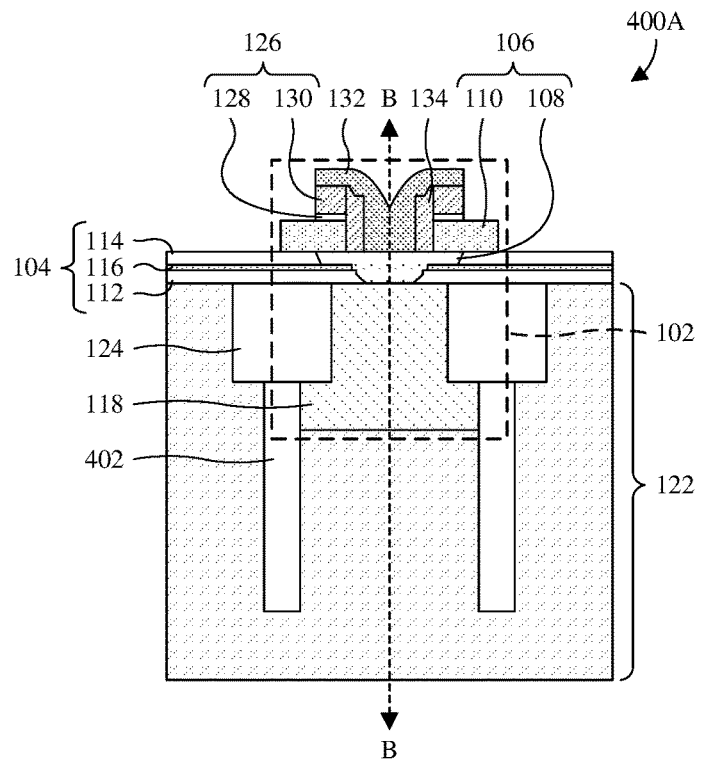
FIGS. 4A and 4B illustrate cross-sectional views of some embodiments of the BJT of FIG. 1 in which the BJT is on a bulk semiconductor substrate.
Figure 4B:
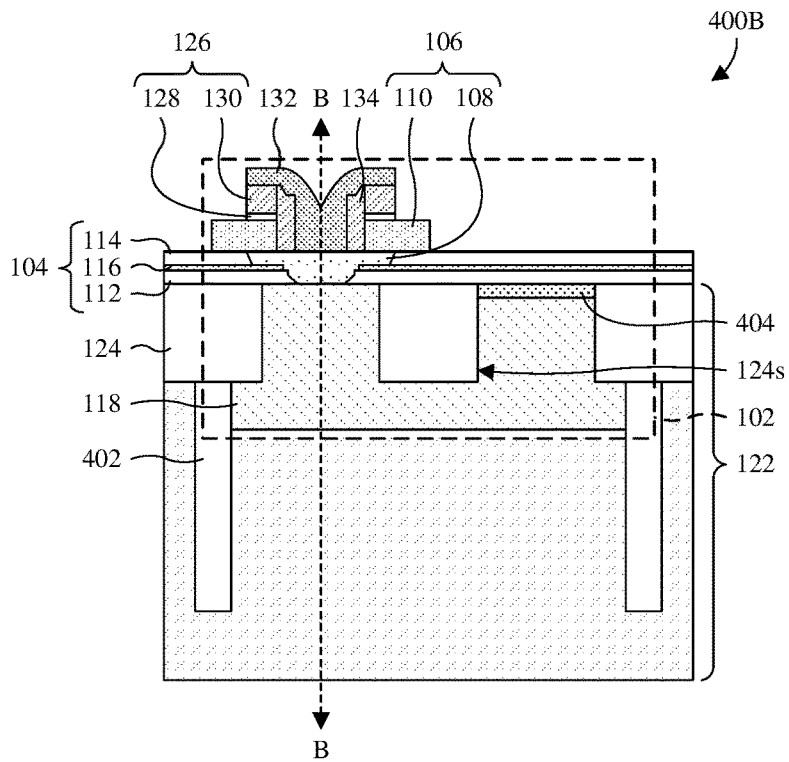

With reference to FIGS. 4A and 4B, cross-sectional views 400A, 400B of some embodiments of the BJT of FIG. 1 are provided in which the semiconductor substrate 122 is a bulk substrate. The cross-sectional view 400A of FIG. 4A may, for example, be taken along line B in the cross-sectional view 400B of FIG. 4B, and the cross-sectional view 400B of FIG. 4B may, for example, be taken along line B in the cross-sectional view 400A of FIG. 4A.

A first trench isolation structure 124 extends into the semiconductor substrate 122 to a first depth, and a second trench isolation structure 402 overlapping with the first trench isolation structure 124 extends into the semiconductor substrate 122 to a second depth greater than the first depth. The first and second trench isolation structures 124, 402 surround and demarcate the collector 118. Further, the first and second trench isolation structures 124, 402 are or comprise a dielectric and electrically isolate the BJT 102 from other semiconductor devices (not shown) on the semiconductor substrate 122. The first trench isolation structure 124 may, for example, be an STI and/or some other suitable trench isolation structure, and/or the second trench isolation structure 402 may, for example, be a DTI and/or some other suitable trench isolation structure.

With reference specifically to FIG. 4B, the first trench isolation structure 124 comprises a segment 124s separating a collector contact region 404 from a portion of the collector 118 at which the collector 118 and the lower base structure 108 directly contact. The collector contact region 404 overlies the collector 118 and is a doped region of the semiconductor substrate 122 having the same doping type as, but a higher doping concentration than, the collector 118. The collector contact region 404 facilitates electrical coupling of the collector 118 to an interconnect structure (not shown).

Figure 5A:
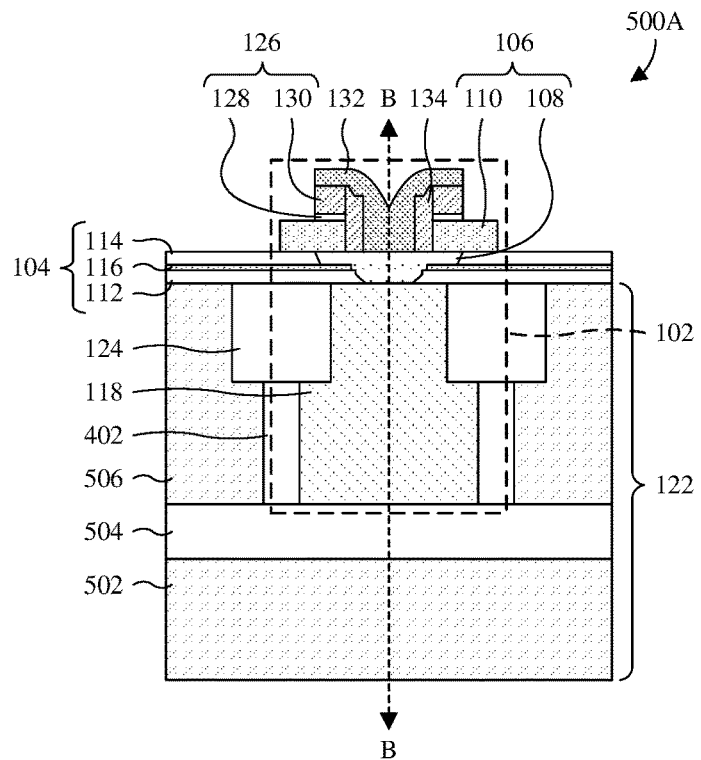
FIGS. 5A and 5B illustrate cross-sectional views of some alternative embodiments of the BJT of FIGS. 4A and 4B in which the BJT is on a semiconductor-on-insulator (SOI) substrate.
Figure 5B:
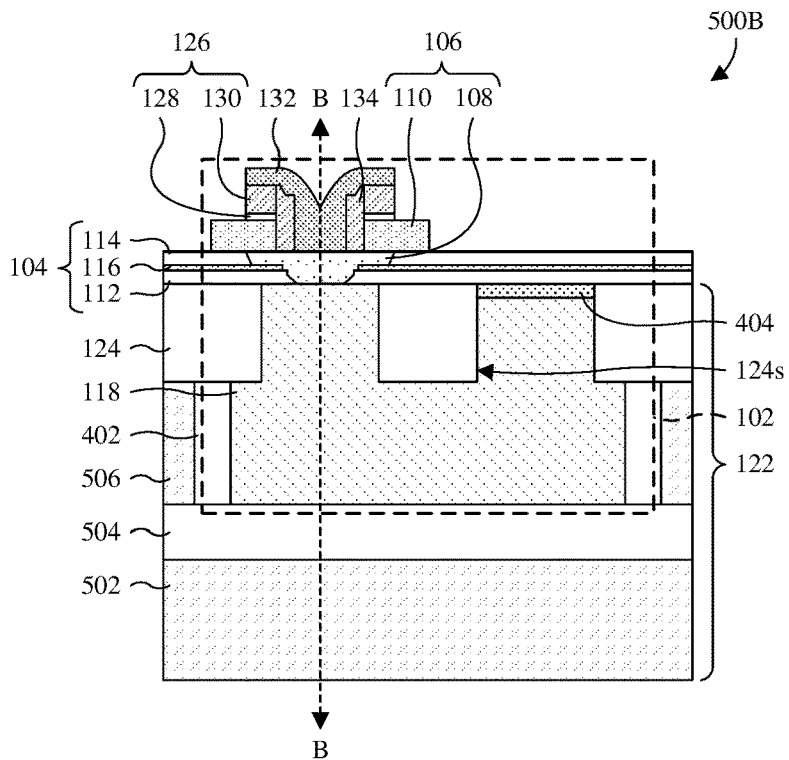

With reference to FIGS. 5A and 5B, cross-sectional views 500A, 500B of some alternative embodiments of the BJT 102 of FIGS. 4A and 4B are provided in which the semiconductor substrate 122 is a SOI substrate. Similar to FIGS. 4A and 4B, the cross-sectional view 500A of FIG. 5A may, for example, be taken along line B in the cross-sectional view 500B of FIG. 5B, and the cross-sectional view 500B of FIG. 5B may, for example, be taken along line B in the cross-sectional view 500A of FIG. 5A. The semiconductor substrate 122 comprises a handle substrate 502, a buried dielectric layer 504, and a device layer 506.

The buried dielectric layer 504 overlies the handle substrate 502 and may, for example, be or comprise silicon oxide and/or some other suitable dielectric(s). The handle substrate 502 may, for example, be or comprise monocrystalline silicon and/or some other suitable type of semiconductor. The device layer 506 overlies the buried dielectric layer 504 and accommodates the collector 118. The device layer 506 may, for example, be or comprise monocrystalline silicon and/or some other suitable type of semiconductor.

The collector 118 extends from the multilayer base dielectric film 104 to the buried dielectric layer 504. Further, the second trench isolation structure 402 extends from the first trench isolation structure 124 to the buried dielectric layer 504. As such, the collector 118 is completely separated from doped regions of other devices (not shown) in the semiconductor substrate 122 by the first and second trench isolation structures 124, 402 and the buried dielectric layer 504. This provided a high degree of electrical isolation between the BJT 102 and the other devices and may hence increase performance of the BJT 102.

While FIGS. 4A and 4B and FIGS. 5A and 5B are illustrated with embodiments of the BJT 102 in FIG. 1, embodiments of the BJT 102 in any of FIGS. 3A-3E may be used instead. Further, while the top layout views 200A, 200B of FIGS. 2A and 2B are described with regard to the BJT 102 of FIG. 1, the top layout views 200A, 200B of FIGS. 2A and 2B are applicable to the BJT 102 in any of FIGS. 3A-3E, 4A, 4B, 5A, and 5B. For example, the BJT 102 in any of FIGS. 3A-3E, 4A, 4B, 5A, and 5B may have a top layout view as in any of FIGS. 2A and 2B.

Figure 6:
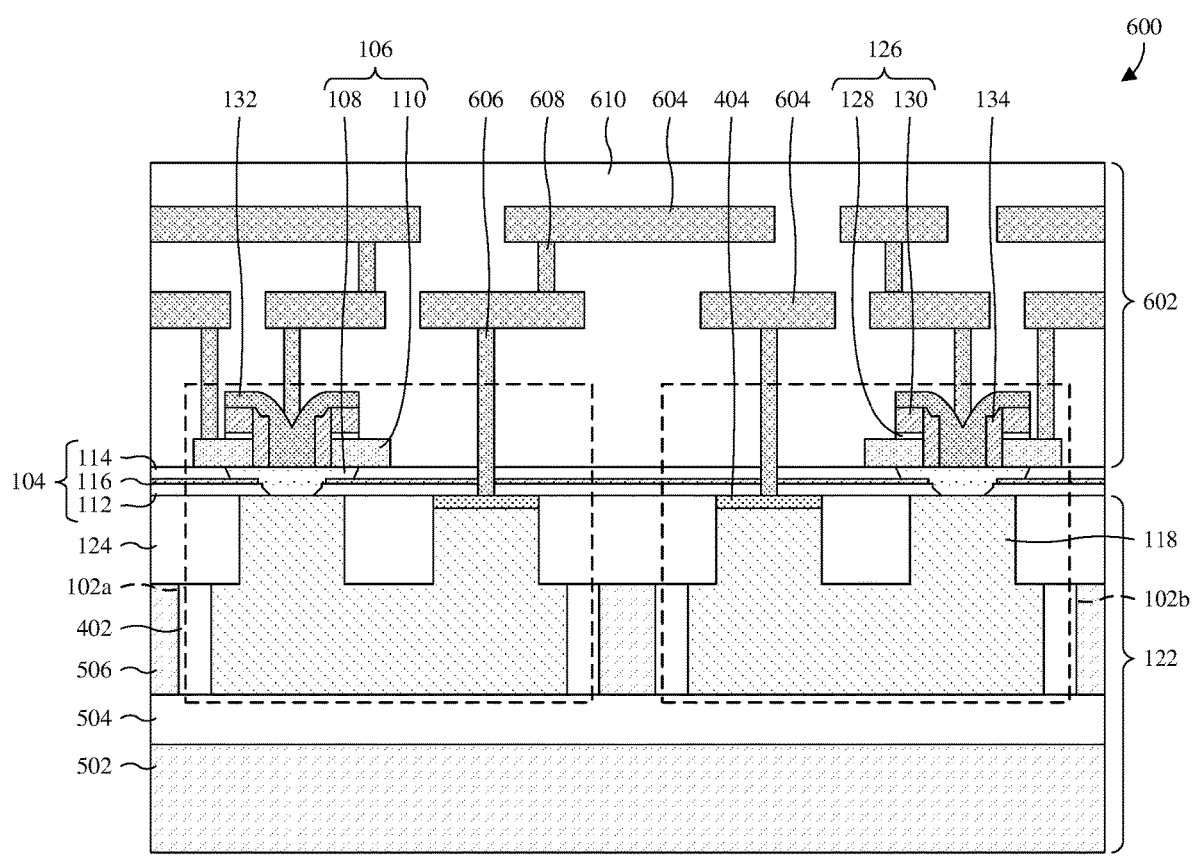
FIG. 6 illustrates a cross-sectional view of some embodiments of an integrated circuit (IC) chip comprising multiple BJTs in which the multiple BJTs share a multilayer base dielectric film and are covered by an interconnect structure.

With reference to FIG. 6, a cross-sectional view 600 of some embodiments of an integrated circuit (IC) chip comprising a first BJT 102a and a second BJT 102b is provided in which the first and second BJTs 102a, 102b share a multilayer base dielectric film 104 and are covered by an interconnect structure 602. The first and second BJTs 102a, 102b are on a semiconductor substrate 122 and are electrically separated from each other by a first trench isolation structure 124 and a second trench isolation structure 402.

The first and second BJTs 102a, 102b are each as the BJT 102 of FIGS. 5A and 5B is illustrated and described but may alternatively have other suitable configurations. In alternative embodiments, the first and second BJTs 102a, 102b are each as the BJT 102 in any of FIGS. 1, 3A-3E, 4A, and 4B is illustrated and described. In some embodiments, the first and second BJTs 102a, 102b each have a top layout view as in any of FIGS. 2A and 2B. Similar to the first and second BJTs 102a, 102b, the semiconductor substrate 122 and the first and second trench isolation structures 124, 402 are as illustrated in FIGS. 5A and 5B but may alternatively have other suitable configurations. In alternative embodiments, the semiconductor substrate 122 is as illustrated and described in FIGS. 4A and 4B and/or the first and second trench isolation structures 124, 402 are as illustrated and described in FIGS. 4A and 4B.

In some embodiments, the first BJT 102a is an NPN-type BJT, whereas the second BJT 102b is a PNP-type BJT, or versa. For example, the collector 118 of the first BJT 102a and the emitter 132 of the first BJT 102a may be N-type, whereas the base 106 of the first BJT 102a may be P-type. Further, the collector 118 of the second BJT 102b and the emitter 132 of the second BJT 102b may be P-type, whereas the base 106 of the second BJT 102b may be N-type. In alternative embodiments, the first and second BJTs 102a, 102b are both NPN-type BJTs or PNP-type BJTs.

The interconnect structure 602 covers and electrically couples to the first and second BJTs 102a, 102b. The interconnect structure 602 comprises a plurality of wires 604, a plurality of contacts 606, and a plurality of vias 608. The wires 604 are stacked with the contacts 606 and the vias 608 in an interconnect dielectric layer 610 and define conductive paths leading from the first and second BJTs 102a, 102b. The contacts 606 extend from the base 106, the emitter 132, and the collector contact region 404. The wires 604 and the vias 608 overlie and electrically couple to the contacts 606. While the interconnect structure 602 is shown with two levels of wires and a single level of vias, the interconnect structure 602 may comprise additional levels of wires and/or additional levels of vias in alternative embodiments.

The contacts 606 may, for example, be or comprise tungsten and/or some other suitable conductive material(s). The wires 604 and the vias 608 may, for example, be or comprise copper, aluminum copper, aluminum, some other suitable conductive material(s), or any combination of the foregoing. The interconnect dielectric layer 610 may, for example, be or comprise silicon oxide and/or some other suitable dielectric(s).

With reference to FIGS. 7-18, a series of cross-sectional views 700-1800 of some embodiments of a method for forming a BJT comprising multiple base dielectric layers is provided. The method may, for example, be employed to form the BJT according to embodiments illustrated and described in FIG. 1 or other suitable embodiments.

Figure 7:
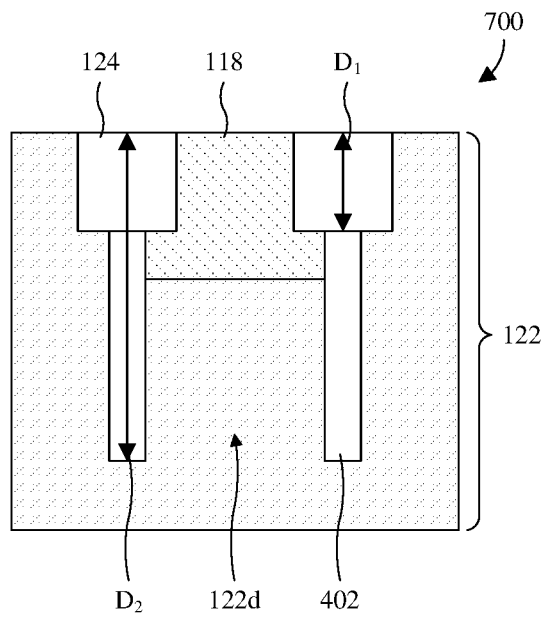
FIGS. 7-18 illustrate a series of cross-sectional views of some embodiments of a method for forming a BJT comprising a multilayer base dielectric film.

As illustrated by the cross-sectional view 700 of FIG. 7, a first trench isolation structure 124 and a second trench isolation structure 402 are formed. The first and second trench isolation structures 124, 402 overlap and extend into a semiconductor substrate 122 respectively to a first depth $D_1$ and a second depth $D_2$ greater than the first depth $D_1$. Further, the first and second trench isolation structures 124, 402 surround and demarcate a device region 122d of the semiconductor substrate 122 at which a collector 118 is subsequently formed. The first trench isolation structure 124 is or comprises a dielectric and may, for example, be a STI or some other suitable type of trench isolation structure. Similarly, the second trench isolation structure 402 is or comprises a dielectric and may, for example, be a DTI or some other suitable type of trench isolation structure. The semiconductor substrate 122 may, for example, be or comprise monocrystalline silicon and/or some other suitable semiconductor material.

Also illustrated by the cross-sectional view 700 of FIG. 7, the collector 118 is formed in the semiconductor substrate 122. The collector 118 is a doped region of the semiconductor substrate 122 having a P-type doping or an N-type doping. The collector 118 may, for example, be formed by ion implantation and/or some other suitable doping process.

Figure 8:
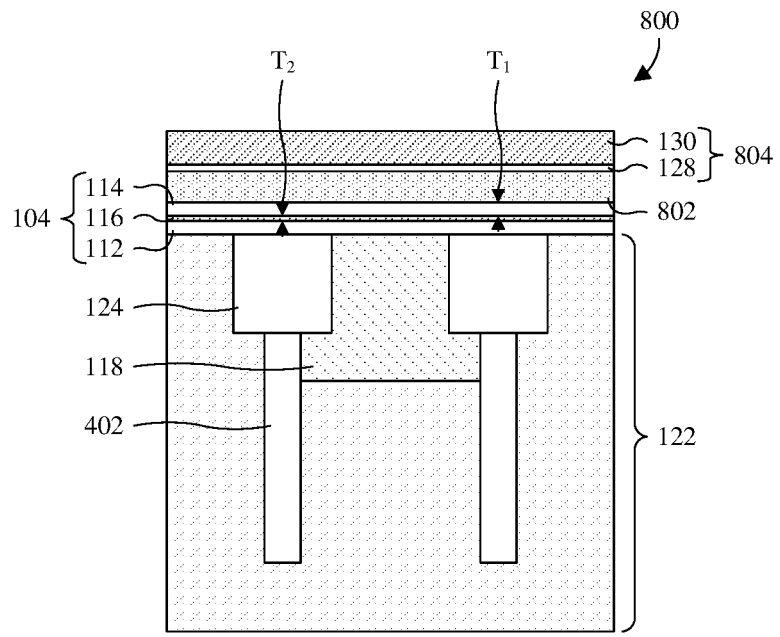

As illustrated by the cross-sectional view 800 of FIG. 8, a multilayer base dielectric film 104 is deposited over the semiconductor substrate 122. The multilayer base dielectric film 104 comprises a lower base dielectric layer 112, an upper base dielectric layer 114, and an intermediate base dielectric layer 116. The lower and upper base dielectric layers 112, 114 respectively underlie and overlie the intermediate base dielectric layer 116, such that the intermediate base dielectric layer 116 is buried in the multilayer base dielectric film 104. Further, the lower and upper base dielectric layers 112, 114 are different dielectrics than the intermediate base dielectric layer 116 and, in some embodiments, are the same dielectric.

The lower and upper base dielectric layers 112, 114 may, for example, be or comprise silicon oxide, silicon oxynitride, some other suitable dielectric(s), or any combination of the foregoing. The intermediate base dielectric layer 116 may, for example, be or comprise silicon nitride, silicon oxynitride, silicon carbide, some other suitable dielectric(s), or any combination of the foregoing. In some embodiments, the lower and upper base dielectric layers 112, 114 are silicon oxide, whereas the intermediate base dielectric layer 116 is silicon nitride, such that the multilayer base dielectric film 104 is an ONO dielectric film.

In some embodiments, the lower and upper base dielectric layers 112, 114 have individual first thicknesses $T_1$ that are about 160 angstroms, about 100-115 angstroms, about 100-160 angstroms, about 40-100 angstroms, or some other suitable value. In some embodiments, the intermediate base dielectric layer 116 has a second thickness $T_2$ that is about 30 angstroms, about 50 angstroms, about 10-50 angstroms, about 25-75 angstroms, or some other suitable value. If the first thicknesses $T_1$ and/or the second thickness $T_2$ is/are too large (e.g., above the above ranges and/or values), a lower base structure hereafter formed may be too thick and hence a base of the BJT being formed may have a high resistance. The high resistance may, in turn, negatively impact the transition frequency of the BJT, the maximum oscillation frequency of the BJT, and other suitable parameters of the BJT. If the first thicknesses $T_1$ and/or the second thickness $T_2$ is/are too small (e.g., below the above ranges and/or values), the multilayer base dielectric film 104 may be too thin and hence leakage current may be high. This may, in turn, negatively impact performance of the BJT being formed. Further, if the second thickness $T_2$ is too small (e.g., less than about 10 angstroms or some other suitable value), the intermediate base dielectric layer 116 may be too thin to serve as an etch stop during subsequent processing and control over the profile of a lower base structure hereafter formed may be poor.

The multilayer base dielectric film 104 may, for example, be deposited by a series of deposition processes corresponding to the individual layers (e.g., 112, 114, and 116) of the multilayer base dielectric film 104. The deposition processes may each be chemical vapor deposition (CVD), physical vapor deposition (PVD), some other suitable deposition process(es), or any combination of the foregoing. In some embodiments, the lower base dielectric layer 112 is deposited by thermal oxidation, whereas the intermediate base dielectric layer 116 and the upper base dielectric layer 114 are deposited by vapor deposition.

Also illustrated by the cross-sectional view 800 of FIG. 8, a first semiconductor layer 802 is deposited over the multilayer base dielectric film 104. The first semiconductor layer 802 has an opposite doping type as the collector 118. For example, the first semiconductor layer 802 may have a P-type doping, whereas the collector 118 may have an N-type doping, or vice versa. The first semiconductor layer 802 may, for example, be polysilicon and/or some other suitable semiconductor material(s). In some embodiments, the first semiconductor layer 802 and the semiconductor substrate 122 share a common semiconductor element and/or have the same or similar bandgaps. For example, the first semiconductor layer 802 and the semiconductor substrate 122 may respectively be polysilicon and monocrystalline silicon and may hence have the same or similar bandgaps.

Also illustrated by the cross-sectional view 800 of FIG. 8, a multilayer hard mask film 804 is deposited over the first semiconductor layer 802. The multilayer hard mask film 804 comprises a lower hard mask layer 128 and an upper hard mask layer 130. In alternative embodiments, the lower hard mask layer 128 and/or the upper hard mask layer 130 is/are omitted. The lower and upper hard mask layers 128, 130 are vertically stacked and are different dielectrics. For example, the lower hard mask layer 128 may be or comprise silicon oxide, whereas the upper hard mask layer 130 may be or comprise silicon nitride. Other suitable dielectrics are, however, amenable. In some embodiments, the lower hard mask layer 128 is or comprises the same dielectric material as the lower base dielectric layer 112 and/or the upper base dielectric layer 114. Further, in some embodiments, the upper hard mask layer 130 is or comprises the same dielectric material as the intermediate base dielectric layer 116.

Figure 9:
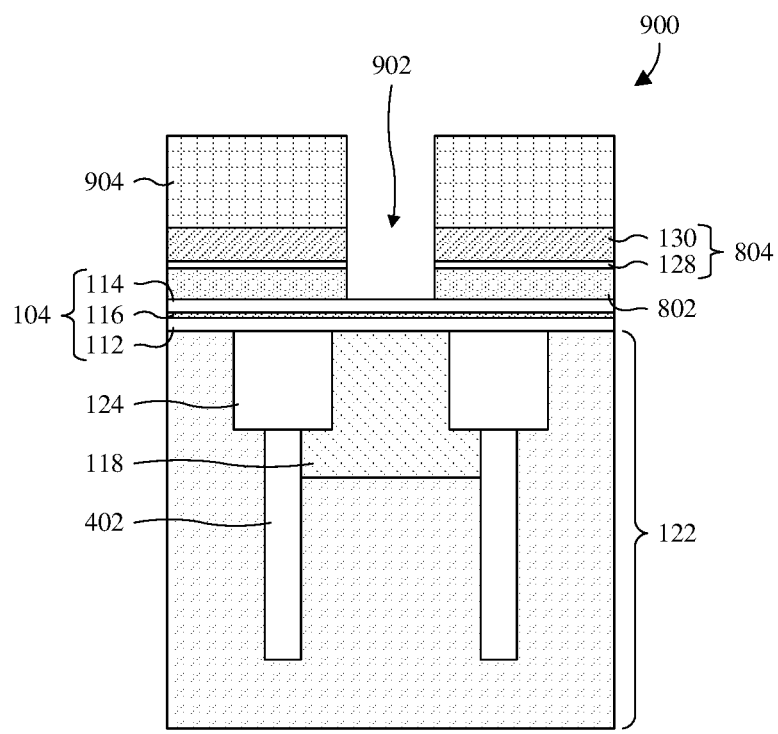

As illustrated by the cross-sectional view 900 of FIG. 9, the multilayer hard mask film 804 and the first semiconductor layer 802 are patterned to form an opening 902 overlying the collector 118 and exposing the multilayer base dielectric film 104. The patterning may, for example, comprise: 1) forming a mask 904 with a layout of the opening 902 over the multilayer hard mask film 804; 2) etching the multilayer hard mask film 804 and the first semiconductor layer 802 with the mask 904 in place; 3) and removing the mask 904. Other suitable processes for the patterning are, however, amenable. The mask 904 may, for example, be a photoresist mask formed by photolithography or some other suitable type of mask. The etching may, for example, be performed by dry etching, but other suitable types of etching are amenable.

Figure 10:
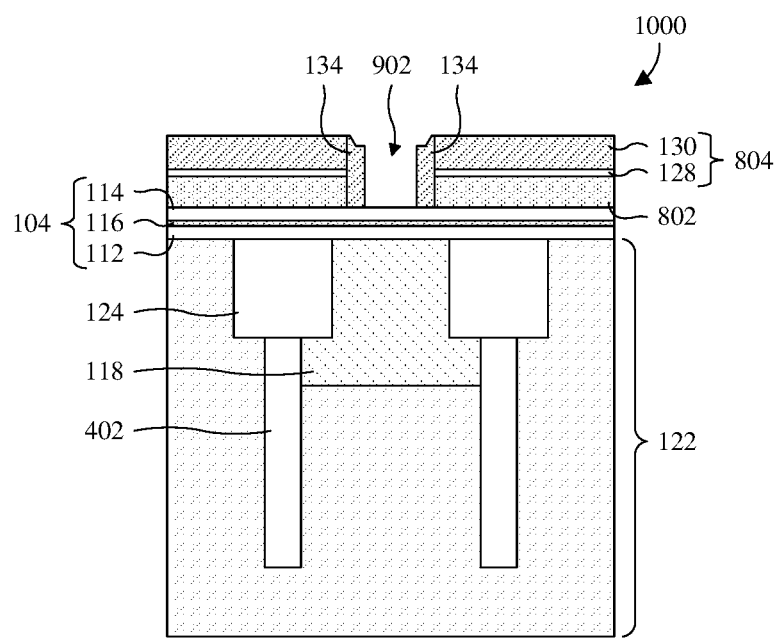

As illustrated by the cross-sectional view 1000 of FIG. 10, a sidewall spacer structure 134 is formed on sidewalls of the opening 902. The sidewall spacer structure 134 may be or comprise silicon nitride and/or some other suitable dielectric material. In some embodiments, the sidewall spacer structure 134 is or comprises the same dielectric material as the upper hard mask layer 130 and/or as the intermediate base dielectric layer 116. In some embodiments, the sidewall spacer structure 134 has a top layout as in any of FIGS. 2A and 2B. A process for forming the sidewall spacer structure 134 may, for example, comprise: 1) depositing a spacer layer covering the multilayer hard mask film 804 and further lining the opening 902; and 2) etching back the spacer layer. Other suitable processes are, however, amenable.

Figure 11:
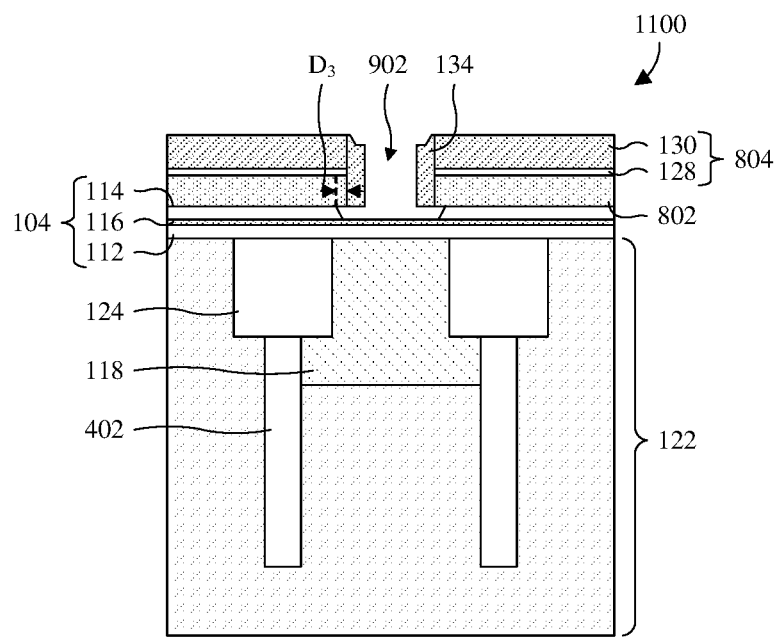

As illustrated by the cross-sectional view 1100 of FIG. 11, a first etch is performed into the upper base dielectric layer 114 through the opening 902. The first etch vertically etches the upper base dielectric layer 114, and stops on the intermediate base dielectric layer 116, to extend the opening 902 to the intermediate base dielectric layer 116. Hence, the intermediate base dielectric layer 116 serves as an etch stop. Further, the first etch laterally etches the upper base dielectric layer 114 to extend the opening 902 under the sidewall spacer structure 134 and the first semiconductor layer 802. Hence, the first etch undercuts the sidewall spacer structure 134 and the first semiconductor layer 802.

The first etch employs an etchant having a high etch rate for the upper base dielectric layer 114 relative to an etch rate for the intermediate base dielectric layer 116. The high etch rate may, for example, be about 10-40, about 20-30, about 20, or about 30 times greater than the etch rate for the intermediate base dielectric layer 116. Other suitable multiples are, however, amenable. In some embodiments, the etchant also has a high etch rate for the upper base dielectric layer 114 relative to an etch rate for the upper hard mask layer 130 and/or relative to an etch rate for the sidewall spacer structure 134. The first etch may, for example, be performed by wet etching, but other suitable types of etching are amenable. In some embodiments in which the first etch is performed by wet etching, the etchant may, for example, be a wet etchant comprising deionized water and 1% hydrogen fluoride by mass. Other suitable wet etchants and/or mass percentages are, however, amenable.

Upon completion of the first etch, the opening 902 extends under the first semiconductor layer 802 by a distance $D_3$. The distance $D_3$ may, for example, be about 1-10 nanometers, about 10-20 nanometers, or some other suitable amount. As will be seen hereafter, the lateral etching together with use of the intermediate dielectric layer 116 as an etch stop facilitates an increase in contact area between constituents of a base for the BJT being formed. The increased contact area reduces a resistance of the base and hence reduces a transit time of the BJT. This, in turn, enhances the transition frequency of the BJT, the maximum oscillation frequency of the BJT, and other suitable parameters of the BJT. If the distance $D_3$ is too small (e.g., less than about 1 nanometer or some other suitable value), the contact area may be small and hence performance of the BJT will be poor. If the distance $D_3$ is too large (e.g., greater than about 20 nanometers or some other suitable value), the first semiconductor layer 802 may collapse into the opening 902 during the first etch or during subsequent etching.

Figure 12:
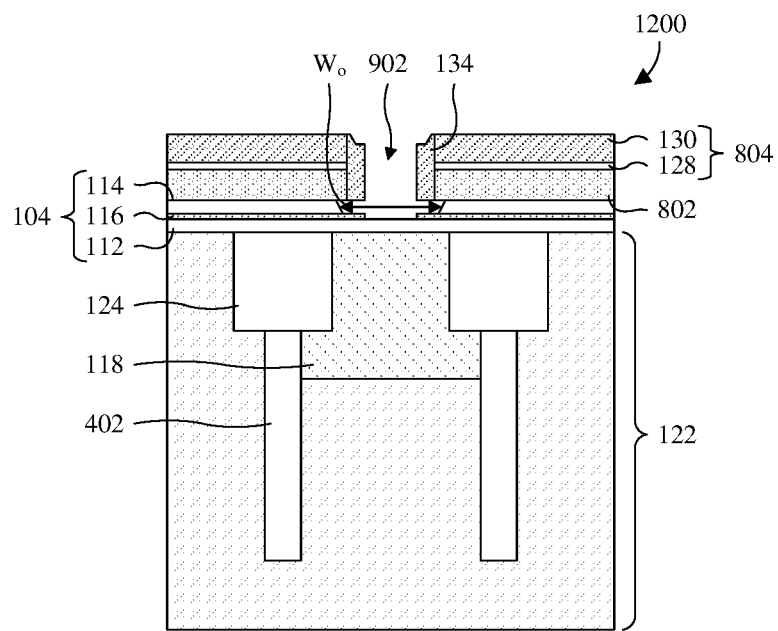

As illustrated by the cross-sectional view 1200 of FIG. 12, a second etch is performed into the intermediate base dielectric layer 116 through the opening 902. The second etch vertically etches the intermediate base dielectric layer 116, and stops on the lower base dielectric layer 112, to extend the opening 902 to the lower base dielectric layer 112. Hence, the lower base dielectric layer 112 serves as an etch stop. Further, the second etch is anisotropic and has little to no lateral etching so a width $W_o$ of the opening 902 is less at the intermediate base dielectric layer 116 than at the upper base dielectric layer 114. This may, for example, minimize area of the collector 118 exposed hereafter and may hence minimizes damage to the collector 118. By minimizing damage to the collector 118, leakage current may be reduced and performance of the BJT being formed may be enhanced. In alternative embodiments, the second etch may be isotropic and may hence have lateral etching. However, this may come at the expense of increased damage to the collector 118.

The second etch employs an etchant having a high etch rate for the intermediate base dielectric layer 116 relative to an etch rate for the lower base dielectric layer 112. The high etch rate may, for example, be about 10-40, about 20-30, about 20, or about 30 times greater than the etch rate for the lower base dielectric layer 112. Other suitable multiples are, however, amenable. In some embodiments, the etchant also has a high etch rate for the upper hard mask layer 130 and/or the sidewall spacer structure 134 relative to the etch rate for the lower base dielectric layer 112. As such, a thickness of the upper hard mask layer 130 and/or a height of the sidewall spacer structure 134 may be reduced. The second etch may, for example, be performed by dry etching, but other suitable types of etching are amenable.

Figure 13:
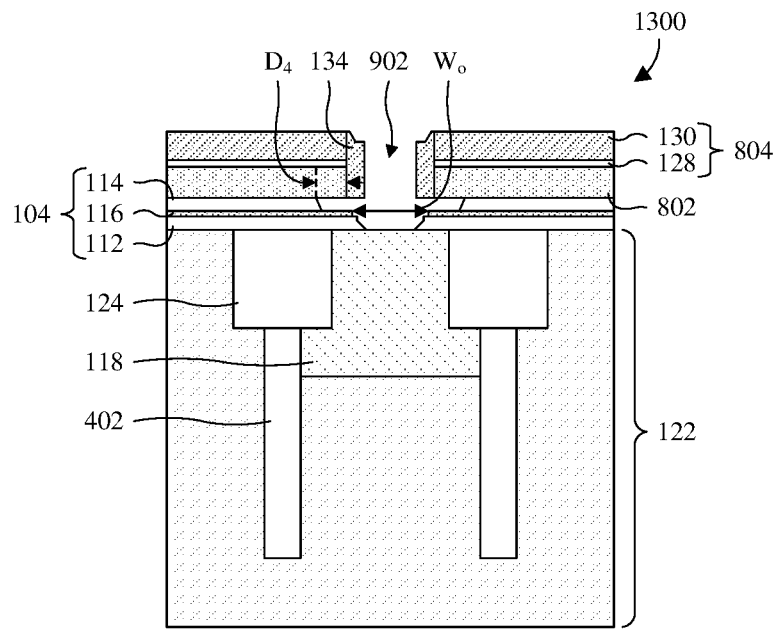

As illustrated by the cross-sectional view 1300 of FIG. 13, a third etch is performed into the lower base dielectric layer 112 through the opening 902. The third etch vertically etches the lower base dielectric layer 112, and stops on the collector 118, to extend the opening 902 to the collector 118. Further, the third etch laterally etches the upper base dielectric layer 114 to extend the opening 902 further under the first semiconductor layer 802. In other words, the third etch further undercuts the first semiconductor layer 802.

The third etch employs an etchant having a high etch rate for the lower base dielectric layer 112 relative to an etch rate for the collector 118. The high etch rate may, for example, be about 10-40, about 20-30, about 20, or about 30 times greater than the etch rate for the collector 118. Other suitable multiples are, however, amenable. Because the high etch rate is high relative to the etch rate for the collector 118, over etching into the collector 118 may be low and hence damage to the collector 118 from over etching may be low. This may lead to low leakage current and may hence enhance performance of the BJT being formed.

In some embodiments, the etchant also has a high etch rate for the lower base dielectric layer 112 relative to an etch rate for the intermediate base dielectric layer 116. As such, the intermediate base dielectric layer 116 masks underlying portions of the lower base dielectric layer 112. This leads to the width $W_o$ of the opening 902 being less at the lower base dielectric layer 112 than at the upper base dielectric layer 114. Because the width $W_o$ may be less at the lower base dielectric layer 112, exposed area of the collector 118 in the opening 902 may be low. Hence, damage to the collector 118 from over etching and exposure to an ambient environment may be low. The low damage may lead to low leakage current and may hence enhance performance of the BJT being formed. In some embodiments, the etchant also has a high etch rate for the lower base dielectric layer 112 relative to an etch rate for the upper hard mask layer 130 and/or relative to an etch rate for the sidewall spacer structure 134.

In some embodiments, the etchant has the same etch rate for the upper base dielectric layer 114 as for the lower base dielectric layer 112. In some embodiments, the etchant has a high etch rate for the upper base dielectric layer 114 relative to the etch rate for the intermediate base dielectric layer 116, the etch rate for the upper hard mask layer 130, the etch rate for the sidewall spacer structure 134, the etch rate for the collector 118, or any combination of the foregoing.

The third etch may, for example, be performed by wet etching, but other suitable types of etching are amenable. In some embodiments in which the third etch is performed by wet etching, the etchant may, for example, be a wet etchant comprising deionized water and 1% hydrogen fluoride by mass. Other suitable wet etchants and/or mass percentages are, however, amenable. In some embodiments, the first and third etches employ the same etchant.

Upon completion of the third etch, the opening 902 extends under the first semiconductor layer 802 by a distance $D_4$. The distance $D_4$ is greater than the distance $D_3$ in FIG. 11 and may, for example, be about 10-50 nanometers, about 10-30 nanometers, about 30-50 nanometers, or some other suitable amount. As will be seen hereafter, the distance $D_4$ corresponds to overlap between constituents of a base for the BJT being formed. The larger the distance $D_4$, the larger the contact area between the constituents. If the distance $D_4$ is too small (e.g., less than about 10 nanometers or some other suitable value), the contact area may be small and hence performance of the BJT will be poor. If the distance $D_4$ is too large (e.g., greater than about 50 nanometers or some other suitable value), the first semiconductor layer 802 may collapse into the opening 902 and yields may be low.

Figure 14:
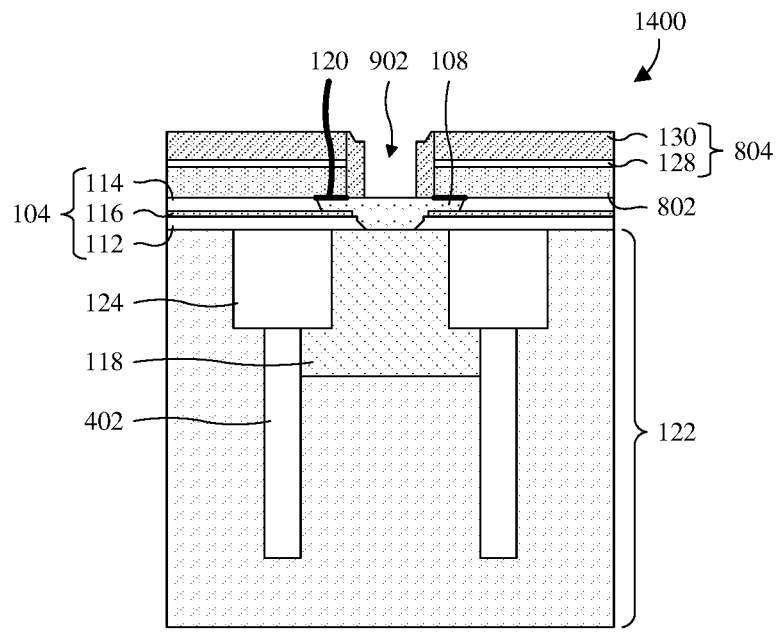

As illustrated by the cross-sectional view 1400 of FIG. 14, a lower base structure 108 is deposited partially filling the opening 902 at a bottom of the opening 902. Upon completion of the deposition, the lower base structure 108 overlies and directly contacts the collector 118. Further, the lower base structure 108 underlies the first semiconductor layer 802 and directly contacts the first semiconductor layer 802 at a contact area 120. Because of the lateral etching at FIG. 12, the contact area 120 may be large.

Because the contact area 120 may be large, the contact resistance between the lower base structure 108 and the first semiconductor layer 802 (e.g., a resistance at the contact area 120) may be small. As seen hereafter, an upper base structure is formed from the first semiconductor layer 802, and the lower base structure 108 and the upper base structure collectively define the base of the BJT being formed. Because the contact area 120 may be large, resistance between the lower base structure 108 and the upper base structure may be small and hence an overall resistance of the base may be small. Because the resistance of the base may be small, current through the BJT may be large and hence the transit time of the BJT may be small. Because of the large current and the small transit time, the transition frequency of the BJT and the maximum oscillation frequency of the BJT may be high.

The lower base structure 108 is a semiconductor material with a different bandgap than the collector 118 and the first semiconductor layer 802, such that the lower base structure 108 directly contacts the collector 118 and the first semiconductor layer 802 at heterojunctions. In some embodiments, the lower base structure 108 has a lower bandgap than the collector 118 and/or the first semiconductor layer 802. Further, the lower base structure 108 has a same doping type as the first semiconductor layer 802 and an opposite doping type as the collector 118. The lower base structure 108 may, for example, be or comprise silicon germanium, germanium, some other suitable semiconductor, or any combination of the foregoing.

Figure 15:
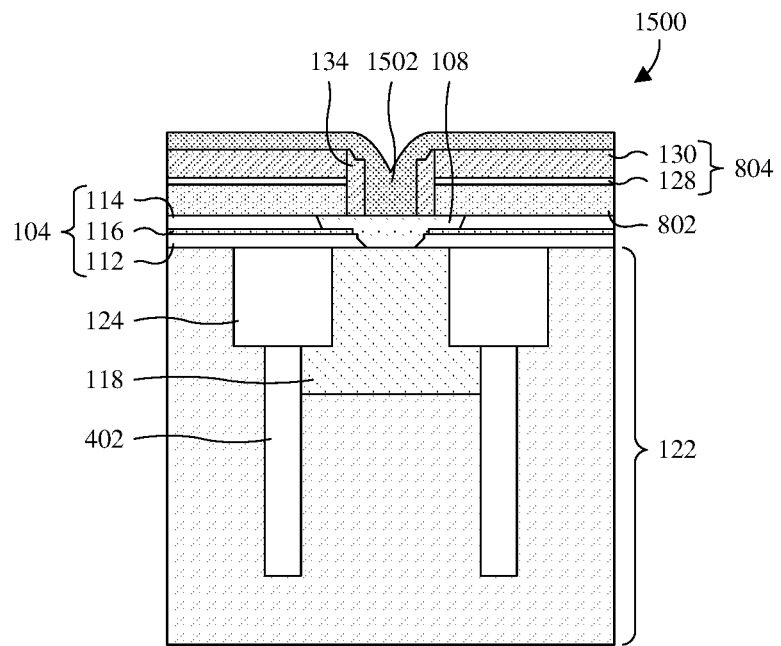

As illustrated by the cross-sectional view 1500 of FIG. 15, a second semiconductor layer 1502 is deposited covering the multilayer hard mask film 804 and filling the opening 902 (see, e.g., FIG. 14). Further, the second semiconductor layer 1502 is deposited over and directly contacting the lower base structure 108.

The second semiconductor layer 1502 is a semiconductor material with a different bandgap than the lower base structure 108, such that the second semiconductor layer 1502 directly contacts the lower base structure 108 at a heterojunction. In some embodiments, the second semiconductor layer 1502 has a higher bandgap than the lower base structure 108. Further, in some embodiments, the second semiconductor layer 1502 has the same or a similar bandgap as the first semiconductor layer 802 and/or the collector 118. The second semiconductor layer 1502 has an opposite doping type as the lower base structure 108 and/or the first semiconductor layer 802. Further, the second semiconductor layer 1502 has the same doping type as the collector 118. The second semiconductor layer 1502 may, for example, be polysilicon and/or some other suitable semiconductor material(s). In some embodiments, the second semiconductor layer 1502 is the same material as the first semiconductor layer 802.

Figure 16:
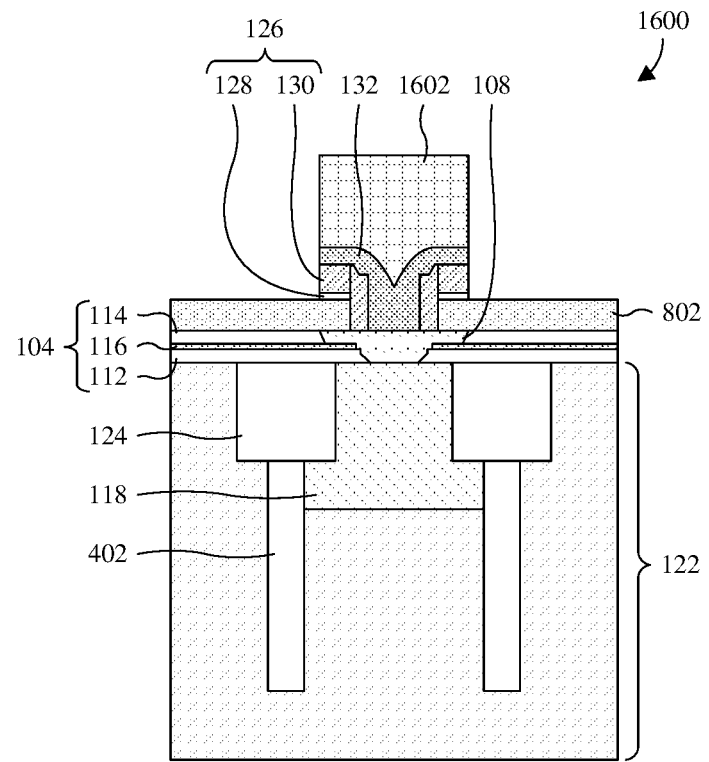

As illustrated by the cross-sectional view 1600 of FIG. 16, the multilayer hard mask film 804 (see, e.g., FIG. 15) and the second semiconductor layer 1502 (see, e.g., FIG. 15) are patterned to respectively form a hard mask 126 and an emitter 132. The emitter 132 may, for example, have a top layout as in any of FIGS. 2A and 2B or some other suitable top layout. The patterning may, for example, comprise: 1) forming a mask 1602 over the second semiconductor layer 1502; 2) etching the multilayer hard mask film 804 and the second semiconductor layer 1502 with the mask 1602 in place; and 3) removing the mask 1602. Other suitable processes for the patterning are, however, amenable. The mask 1602 may, for example, be a photoresist mask formed by photolithography or some other suitable type of mask. The etching may, for example, be performed by dry etching, but other suitable types of etching are amenable.

Figure 17:
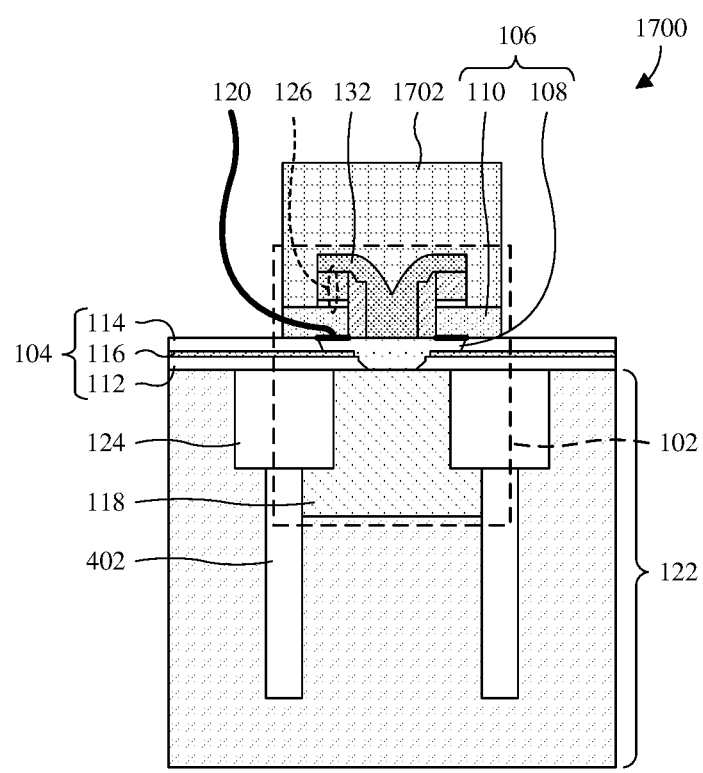

As illustrated by the cross-sectional view 1700 of FIG. 17, the first semiconductor layer 802 (see, e.g., FIG. 16) is patterned to form an upper base structure 110. The upper base structure 110 may, for example, have a top layout as in any of FIGS. 2A and 2B or some other suitable top layout. The lower and upper base structures 108, 110 collectively define a base 106, and the base 106, the collector 118, and the emitter 132 collectively define a BJT 102. As described above, the contact area 120 between the lower and upper base structures 108, 110 is large because of the lateral etching at FIG. 11. The large contact area reduces a resistance of the base 106 and enhances performance of the BJT 102. For example, the transition frequency of the BJT 102, the maximum oscillation frequency of the BJT 102, and other suitable parameters of the BJT 102 may be enhanced by the reduced resistance.

The patterning may, for example, comprise: 1) forming a mask 1702 over the emitter 132; 2) etching the first semiconductor layer 802 with the mask 1702 in place; 3) and removing the mask 1702. Other suitable processes for the patterning are, however, amenable. The mask 1702 may, for example, be a photoresist mask formed by photolithography or some other suitable type of mask. The etching may, for example, be performed by dry etching, but other suitable types of etching are amenable.

Figure 18:
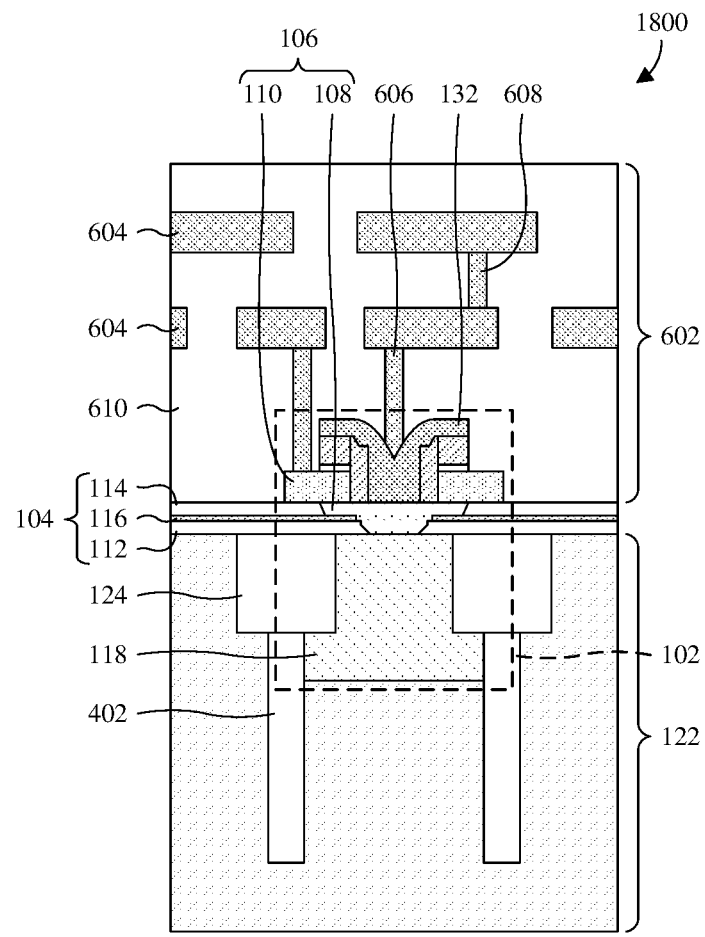

As illustrated by the cross-sectional view 1800 of FIG. 18, an interconnect structure 602 is formed covering and electrically coupled to the BJT 102. The interconnect structure 602 comprises a plurality of wires 604, a plurality of contacts 606, and a plurality of vias 608 (only one of which is shown). The wires 604 are stacked with the contacts 606 and the vias 608 in an interconnect dielectric layer 610 and define conductive paths leading from the BJT 102. The contacts 606 extend from the base 106 and the emitter 132, and the wires 604 and the vias 608 overlie and electrically couple to the contacts 606. While the interconnect structure 602 is shown with two levels of wires and a single level of vias, the interconnect structure 602 may comprise additional levels of wires and/or additional levels of vias in alternative embodiments.

While FIGS. 7-18 are described with reference to a method, it will be appreciated that the structures shown in FIGS. 7-18 are not limited to the method but rather may stand alone separate of the method. While FIGS. 7-18 are described as a series of acts, it will be appreciated that the order of the acts may be altered in other embodiments. While FIGS. 7-18 illustrate and describe as a specific set of acts, some acts that are illustrated and/or described may be omitted in other embodiments. Further, acts that are not illustrated and/or described may be included in other embodiments.

Figure 19:
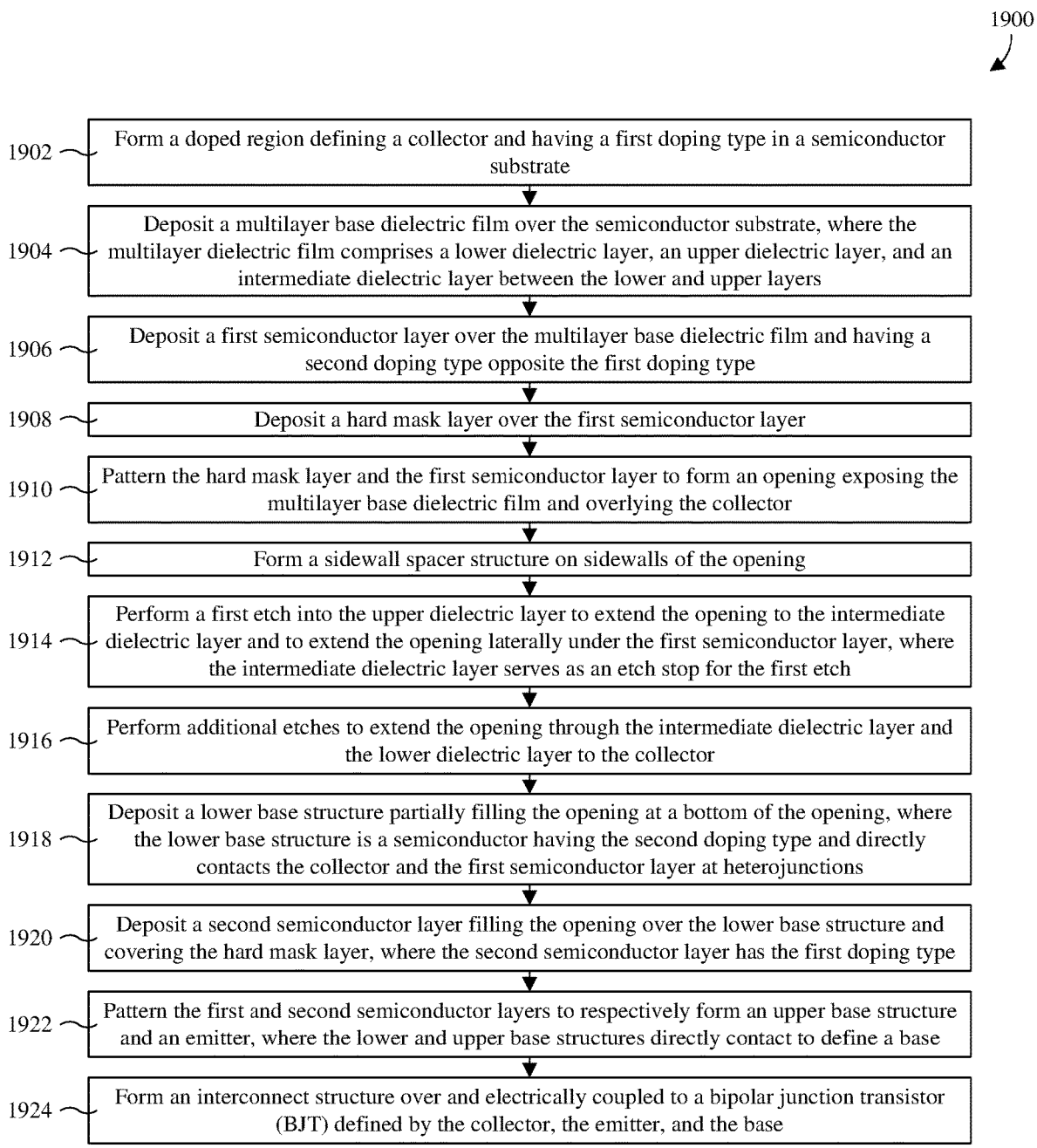
FIG. 19 illustrates a block diagram of some embodiments of the method of FIGS. 7-18.

With reference to FIG. 19, a block diagram 1900 of some embodiments of the method of FIGS. 7-18 is provided.

At 1902, a doped region defining a collector and having a first doping type is formed in a semiconductor substrate. See, for example, FIG. 7.

At 1904, a multilayer base dielectric film is deposited over the semiconductor substrate, where the multilayer dielectric film comprises a lower dielectric layer, an upper dielectric layer, and an intermediate dielectric layer between the lower and upper layers. See, for example, FIG. 8.

At 1906, a first semiconductor layer is deposited over the multilayer base dielectric film and having a second doping type opposite the first doping type. See, for example, FIG. 8.

At 1908, a hard mask layer is deposited over the first semiconductor layer. See, for example, FIG. 8.

At 1910, the hard mask layer and the first semiconductor layer are patterned to form an opening exposing the multilayer base dielectric film and overlying the collector. See, for example, FIG. 9.

At 1912, a sidewall spacer structure is formed on sidewalls of the opening. See, for example, FIG. 10.

At 1914, a first etch is performed into the upper dielectric layer to extend the opening to the intermediate dielectric layer and to extend the opening laterally under the first semiconductor layer, where the intermediate dielectric layer serves as an etch stop for the first etch. See, for example, FIG. 11.

At 1916, additional etches are performed to extend the opening through the intermediate dielectric layer and the lower dielectric layer to the collector. See, for example, FIGS. 12 and 13.

At 1918, a lower base structure is deposited partially filling the opening at a bottom of the opening, where the lower base structure is a semiconductor having the second doping type and directly contacts the collector and the first semiconductor layer at heterojunctions. See, for example, FIG. 14.

At 1920, a second semiconductor layer is deposited filling the opening over the lower base structure and covering the hard mask layer, where the second semiconductor layer has the first doping type. See, for example, FIG. 15.

At 1922, the first and second semiconductor layers are patterned to respectively form an upper base structure and an emitter, where the lower and upper base structures directly contact to define a base. See, for example, FIGS. 16 and 17.

At 1924, an interconnect structure is formed over and electrically coupled to a BJT defined by the collector, the emitter, and the base. See, for example, FIG. 18.

While the block diagram 1900 of FIG. 19 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 20-30, a series of cross-sectional views 2000-3000 of some embodiments of a method for forming a BJT in which an upper base structure and an emitter are formed in a recess. The method may, for example, be employed to form the BJT according to embodiments illustrated and described in FIG. 3E or other suitable embodiments.

Figure 20:
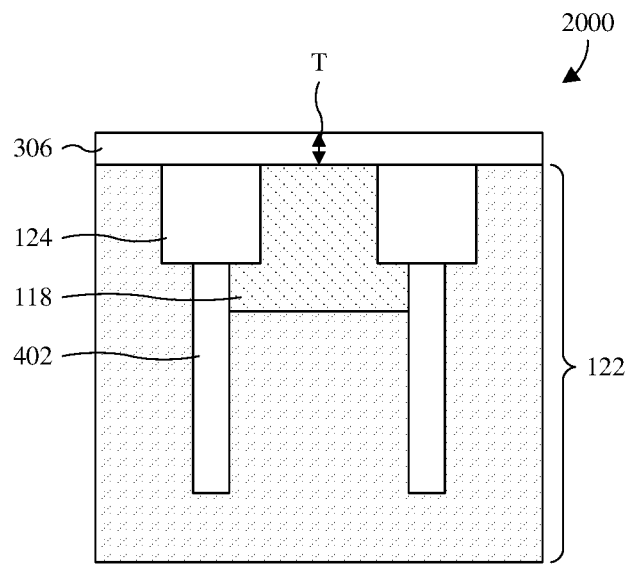
FIGS. 20-30 illustrate a series of cross-sectional views of some embodiments of a method for forming a BJT in which an upper base structure and an emitter are formed in a recess.

As illustrated by the cross-sectional view 2000 of FIG. 20, a first trench isolation structure 124, a second trench isolation structure 402, and a collector 118 are formed in a semiconductor substrate 122 as described with regard to FIG. 7.

Also illustrated by the cross-sectional view 2000 of FIG. 20, a base dielectric layer 306 is deposited over the semiconductor substrate 122. The base dielectric layer 306 may, for example, be or comprise silicon oxide, silicon oxynitride, some other suitable dielectric(s), or any combination of the foregoing. Further, the base dielectric layer 306 may, for example, be deposited by CVD, PVD, thermal oxidation, some other suitable deposition process(es), or any combination of the foregoing.

In some embodiments, a thickness T of the base dielectric layer 306 is about 250-400 angstroms, about 250-325 angstroms, about 325-400 angstroms, about 350 angstroms, or some other suitable value. If the thickness T is too small (e.g., less than about 250 angstroms or some other suitable value), leakage current may be high. This may, in turn, negatively impact performance of the BJT being formed. If the thickness T is too large (e.g., more than about 400 angstroms or some other suitable value), a lower base structure hereafter formed may be too thick and hence a base of the BJT may have a high resistance. The high resistance may, in turn, negatively impact the transition frequency of the BJT, the maximum oscillation frequency of the BJT, and other suitable parameters of the BJT.

Figure 21:
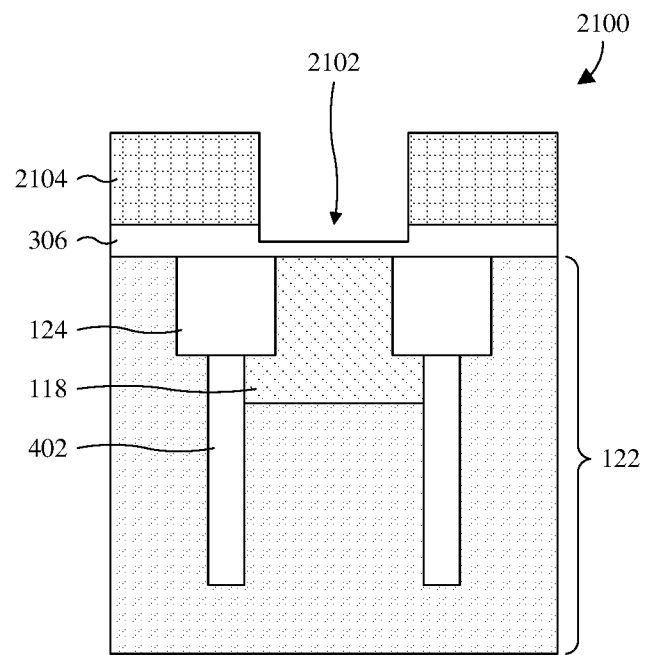

As illustrated by the cross-sectional view 2100 of FIG. 21, the base dielectric layer 306 is patterned to define a recess 2102 overlying the collector 118. The recess 2102 extends partially, but not fully, through the base dielectric layer 306, such that the base dielectric layer 306 separates the recess 2102 from the collector 118. As explained hereafter, the recess 2102 may facilitate a reduction in a resistance of a BJT being formed and may hence facilitate enhancement to the performance of the BJT.

The patterning may, for example, comprise: 1) forming a mask 2104 with a layout of the recess 2102 over the base dielectric layer 306; 2) etching the base dielectric layer 306 with the mask 2104 in place; 3) and removing the mask 2104. Other suitable processes for the patterning are, however, amenable. The mask 2104 may, for example, be a photoresist mask formed by photolithography or some other suitable type of mask. The etching may, for example, be performed by dry etching, but other suitable types of etching are amenable.

Figure 22:
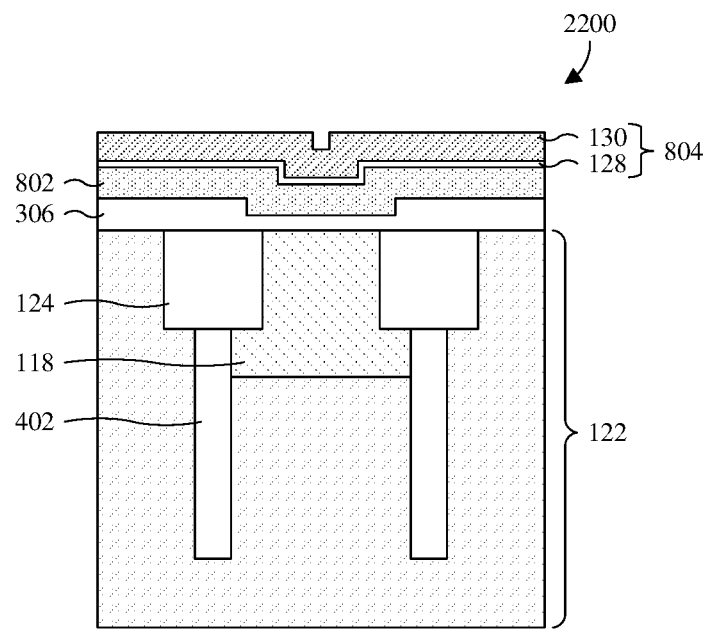

As illustrated by the cross-sectional view 2200 of FIG. 22, a first semiconductor layer 802 and a multilayer hard mask film 804 are deposited stacked over the base dielectric layer 306 and lining the recess 2102 (see, e.g., FIG. 21). The multilayer hard mask film 804 overlies the first semiconductor layer 802 and comprises a lower hard mask layer 128 and an upper hard mask layer 130. In alternative embodiments, the lower hard mask layer 128 and/or the upper hard mask layer 130 is/are omitted. The first semiconductor layer 802 and the multilayer hard mask film 804 are deposited as described with regard to FIG. 8.

Figure 23:
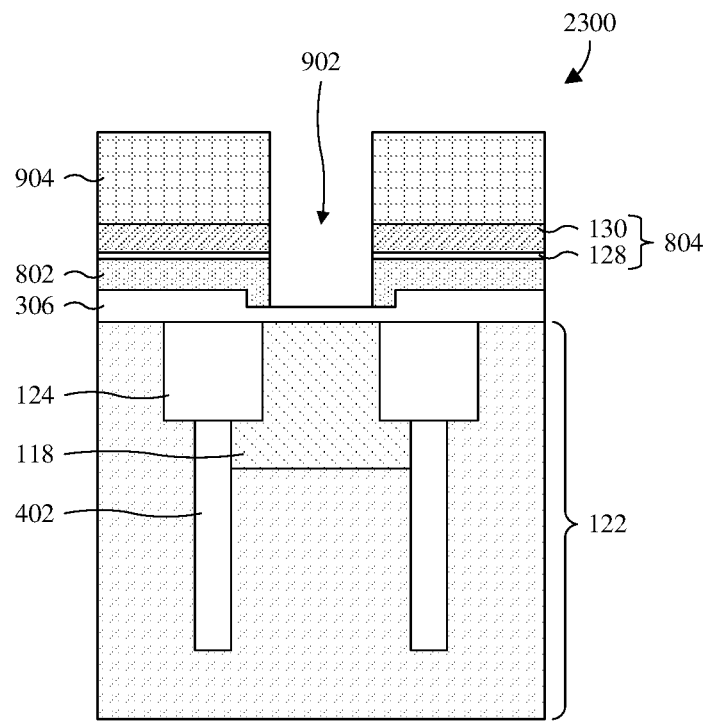
Figure 24:
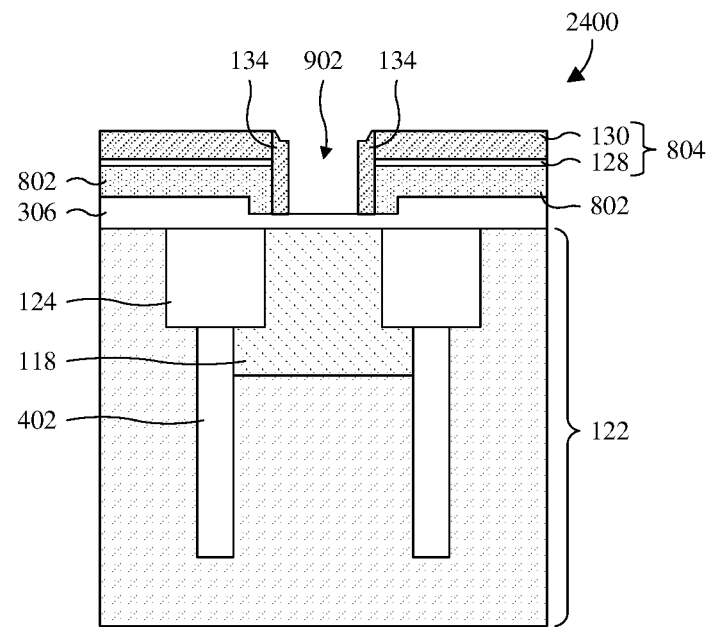

As illustrated by the cross-sectional views 2300, 2400 of FIGS. 23 and 24, the acts at FIGS. 9 and 10 are performed using the base dielectric layer 306 in place of the multilayer base dielectric film 104. At FIG. 23, the multilayer hard mask film 804 and the first semiconductor layer 802 are patterned to form an opening 902 overlying the collector 118 and exposing the base dielectric layer 306 as described with regard to FIG. 9. At FIG. 24, a sidewall spacer structure 134 is formed on sidewalls of the opening 902 as described with regard to FIG. 10.

Figure 25:
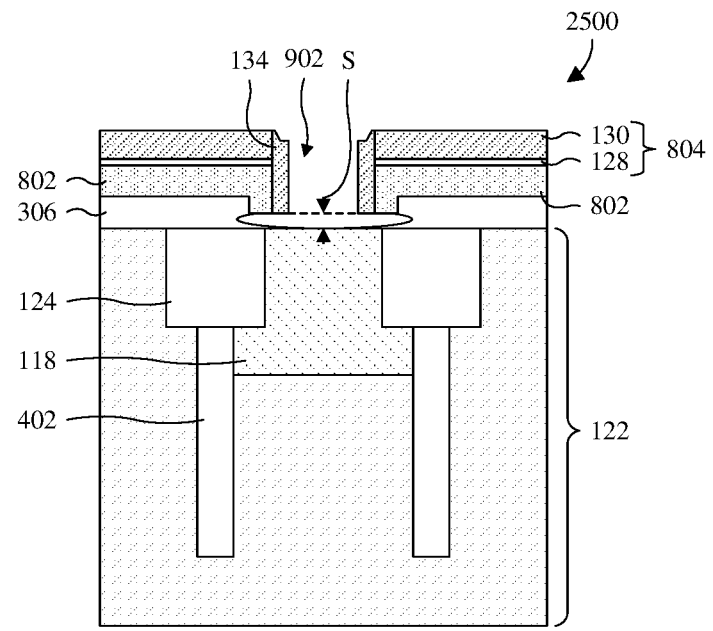
Figure 26:
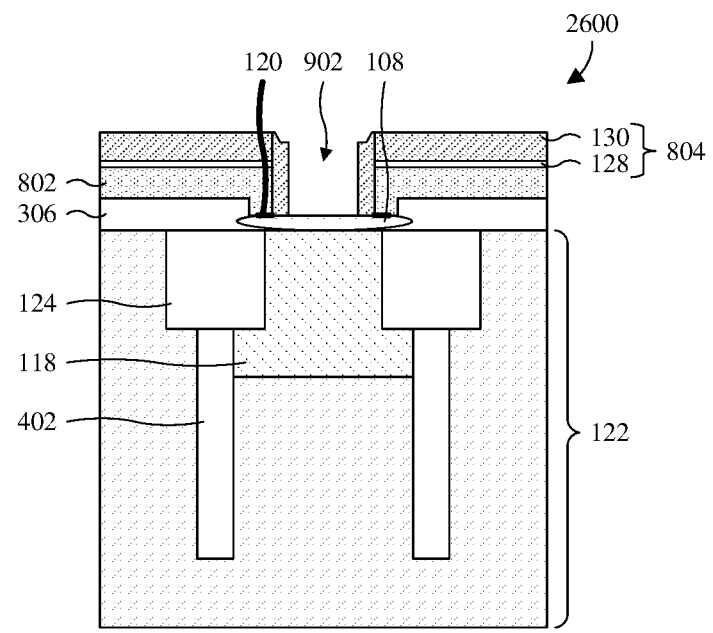
Figure 27:
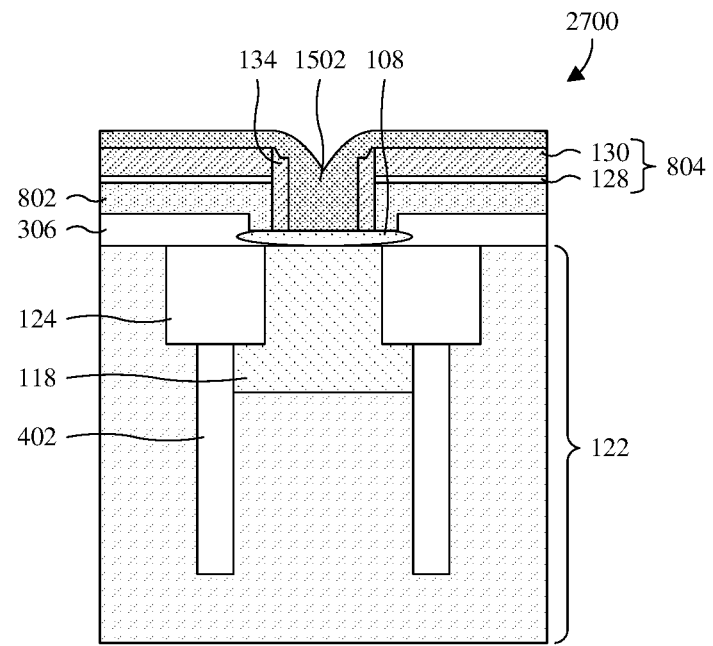
Figure 28:
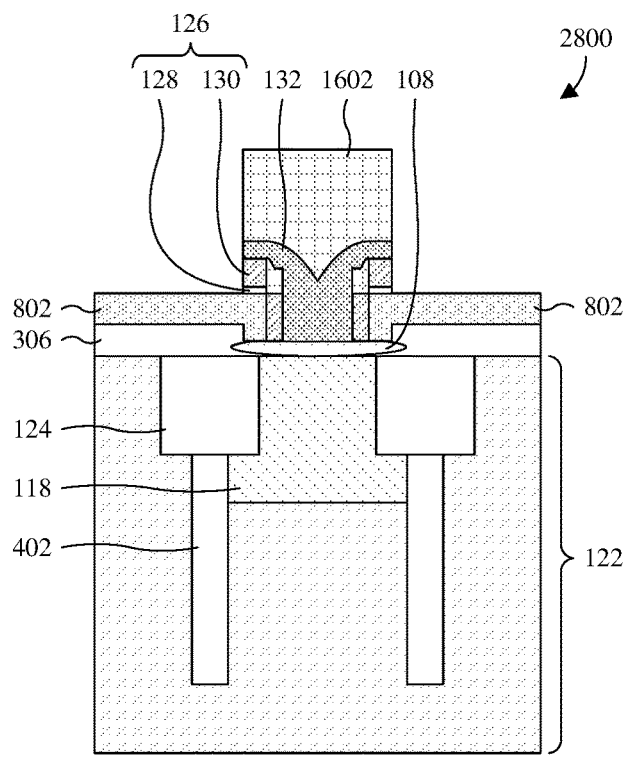
Figure 29:
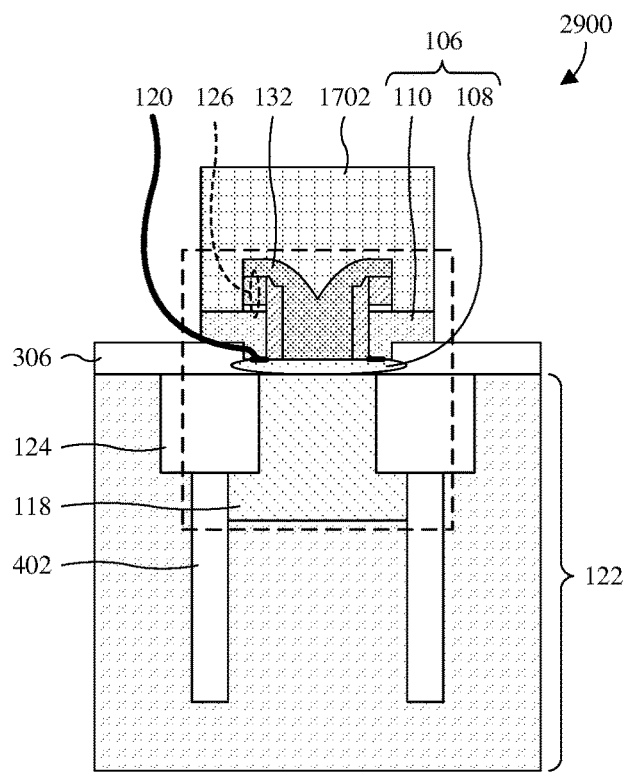
Figure 30:
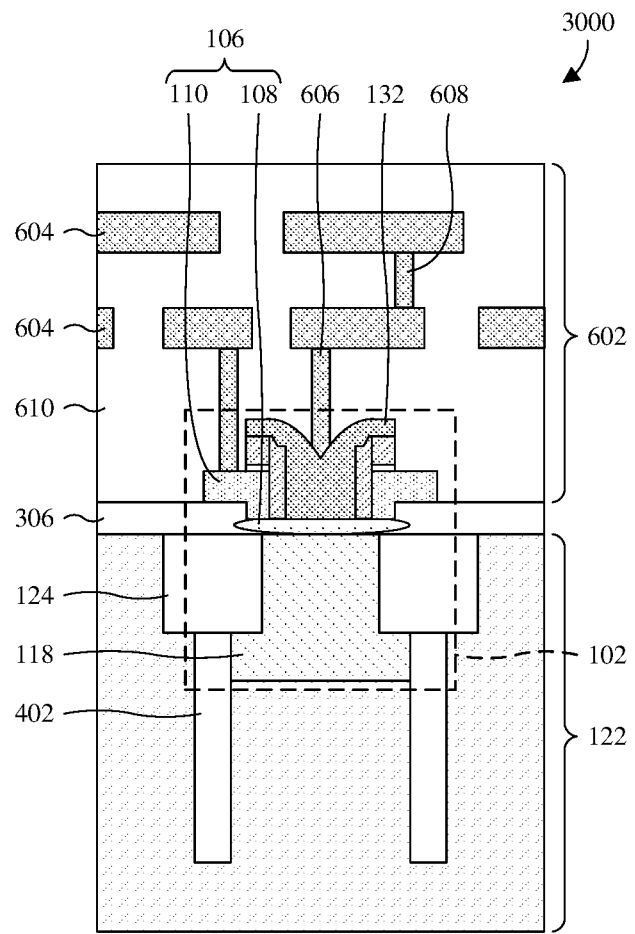

As illustrated by the cross-sectional view 2500 of FIG. 25, an etch is performed into the base dielectric layer 306 through the opening 902. The etch vertically etches the base dielectric layer 306, and stops on the collector 118, to extend the opening 902 to the collector 118. Further, the etch laterally etches the base dielectric layer 306 to extend the opening 902 under the sidewall spacer structure 134 and the first semiconductor layer 802. Hence, the etch undercuts the sidewall spacer structure 134 and the first semiconductor layer 802.

The etch employs an etchant having a high etch rate for the base dielectric layer 306 relative to an etch rate of the collector 118 so over etching into the collector 118 is low. Because of the low over etching, damage to the collector 118 from over etching may be low. The high etch rate may, for example, be about 10-40, about 20-30, about 20, or about 30 times greater than the etch rate for the collector 118. Other suitable multiples are, however, amenable. In some embodiments, the etchant also has a high etch rate for the base dielectric layer 306 relative to an etch rate for the upper hard mask layer 130 and/or relative to an etch rate for the sidewall spacer structure 134. The etch may, for example, be performed by wet etching, but other suitable types of etching are amenable. In some embodiments in which the etch is performed by wet etching, the etchant may, for example, be a wet etchant comprising deionized water and 1% hydrogen fluoride by mass. Other suitable wet etchants and/or mass percentages are, however, amenable.

Upon completion of the etch, a bottom portion of the opening 902 has an oblong profile (e.g., a profile with a high ratio of width to height) extending under the first semiconductor layer 802. Further, because of the recess 2102 (see, e.g., FIG. 21) formed at FIG. 21, the first semiconductor layer 802 wraps around a top corner of the base dielectric layer 306 and extends below a top surface of the base dielectric layer 306. As a result, the separation S between a bottom surface of the first semiconductor layer 802 and the semiconductor substrate 122 is reduced. Because the separation S is reduced, the bottom portion of the opening 902 has a more oblong profile than if the recess 2102 was not formed.

It has been appreciated that by reducing the separation S, the etch more efficiently clears the base dielectric layer 306 from the bottom surface of the first semiconductor layer 802. As such, more of the bottom surface is exposed in the opening 902. As will be seen hereafter, this leads to an increase in contact area between constituents of a base for the BJT being formed. The increased contact area reduces a resistance of the base and hence reduces a transit time of the BJT. This, in turn, enhances the transition frequency of the BJT, the maximum oscillation frequency of the BJT, and other suitable parameters of the BJT.

As illustrated by the cross-sectional views 2600-3000 of FIGS. 26-30, the acts at FIGS. 14-18 are respectively performed. At FIG. 26, a lower base structure 108 is deposited partially filling the opening 902 at a bottom of the opening 902 as described with regard to FIG. 14. The recess (see, e.g., FIG. 21) formed at FIG. 21 leads to more of the first semiconductor layer 802 being exposed in the opening 902, such that the contact area 120 between the lower base structure 108 and the first semiconductor layer 802 is large and performance of the BJT being formed is enhanced. At FIG. 27, a second semiconductor layer 1502 is deposited covering the multilayer hard mask film 804 and filling the opening 902 (see, e.g., FIG. 26) as described with regard to FIG. 15. At FIG. 28, the multilayer hard mask film 804 (see, e.g., FIG. 27) and the second semiconductor layer 1502 (see, e.g., FIG. 27) are patterned to respectively form a hard mask 126 and an emitter 132 as described with regard to FIG. 16. At FIG. 29, the first semiconductor layer 802 (see, e.g., FIG. 28) is patterned to form an upper base structure 110 as described with regard to FIG. 17. The lower and upper base structures 108, 110 collectively define a base 106, and the base 106, the collector 118, and the emitter 132 collectively define a BJT 102. At FIG. 30, an interconnect structure 602 is formed covering and electrically coupled to the BJT 102 as described with regard to FIG. 18.

While FIGS. 20-30 are described with reference to a method, it will be appreciated that the structures shown in FIGS. 20-30 are not limited to the method but rather may stand alone separate of the method. While FIGS. 20-30 are described as a series of acts, it will be appreciated that the order of the acts may be altered in other embodiments. While FIGS. 20-30 illustrate and describe as a specific set of acts, some acts that are illustrated and/or described may be omitted in other embodiments. Further, acts that are not illustrated and/or described may be included in other embodiments.

Figure 31:
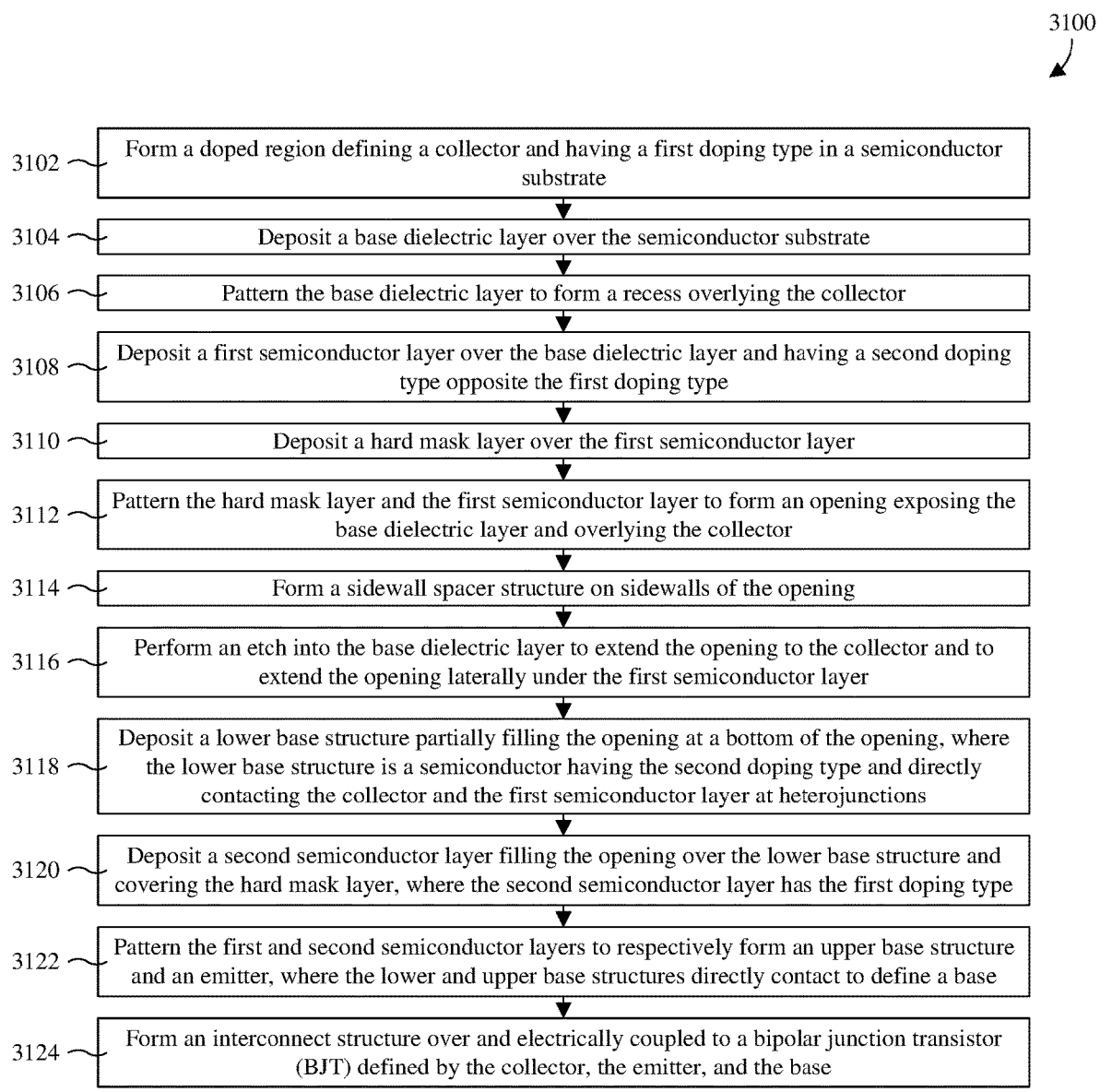
FIG. 31 illustrates a block diagram of some embodiments of the method of FIGS. 20-30.

With reference to FIG. 31, a block diagram 3100 of some embodiments of the method of FIGS. 20-30 is provided.

At 3102, a doped region defining a collector and having a first doping type is formed in a semiconductor substrate. See, for example, FIG. 20.

At 3104, a base dielectric layer is deposited over the semiconductor substrate. See, for example, FIG. 20.

At 3106, the base dielectric layer is patterned to form a recess overlying the collector. See, for example, FIG. 21.

At 3108, a first semiconductor layer is deposited over the base dielectric layer and having a second doping type opposite the first doping type. See, for example, FIG. 22.

At 3110, a hard mask layer is deposited over the first semiconductor layer. See, for example, FIG. 22.

At 3112, the hard mask layer and the first semiconductor layer are patterned to form an opening exposing the base dielectric layer and overlying the collector. See, for example, FIG. 23.

At 3114, a sidewall spacer structure is formed on sidewalls of the opening. See, for example, FIG. 24.

At 3116, an etch is performed into the base dielectric layer to extend the opening to the collector and to extend the opening laterally under the first semiconductor layer. See, for example, FIG. 25.

At 3118, a lower base structure is deposited partially filling the open at a bottom of the opening, where the lower base structure is a semiconductor having the second doping type and directly contacting the collector and the first semiconductor layer at heterojunctions. See, for example, FIG. 26.

At 3120, a second semiconductor layer is deposited filling the opening over the lower base structure and covering the hard mask layer, where the second semiconductor layer has the first doping type. See, for example, FIG. 27.

At 3122, the first and second semiconductor layers are patterned to respectively form an upper base structure and an emitter, where the lower and upper base structures directly contact to define a base. See, for example, FIGS. 28 and 29.

At 3124, an interconnect structure is formed over and electrically coupled to a BJT defined by the collector, the emitter, and the base. See, for example, FIG. 30.

While the block diagram 3100 of FIG. 31 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

The present disclosure provides a BJT including: a substrate; a dielectric film overlying the substrate and including a lower dielectric layer, an upper dielectric layer, and an intermediate dielectric layer between the lower and upper dielectric layers; a lower base structure overlying the intermediate dielectric layer and protruding through the intermediate dielectric layer and the lower dielectric layer to the substrate; an upper base structure overlying the lower base structure, wherein the lower and upper base structures are different semiconductors and directly contact at a heterojunction; and an emitter overlying the upper base structure and extending through the upper base structure to the lower base structure. In some embodiments, the dielectric film includes a first dielectric and a second dielectric, wherein the lower and upper dielectric layers include the first dielectric, and wherein the intermediate dielectric layer includes the second dielectric. In some embodiments, the lower base structure includes germanium, wherein the upper base structure consists essentially of silicon. In some embodiments, the upper base structure has an outer sidewall facing away from the emitter and an inner sidewall facing the emitter, wherein a sidewall of the lower base structure overlies the intermediate dielectric layer laterally between and laterally spaced from the inner and outer sidewalls. In some embodiments, the lower base structure has a T-shaped profile. In some embodiments, the emitter is a semiconductor and directly contacts the lower base structure at a heterojunction. In some embodiments, a top surface of the lower base structure and a top surface of the upper dielectric layer are about even. In some embodiments, the substrate includes a doped region defining a collector and underlying the lower base structure, wherein the doped region has an opposite doping type as the lower and upper base structures.

In some embodiments, the present disclosure provides another BJT including: a semiconductor substrate; a multilayer dielectric film overlying the semiconductor substrate and including a first dielectric layer buried in the multilayer dielectric film; an upper base structure overlying the multilayer dielectric film; a lower base structure inset into the multilayer dielectric film and extending through the multilayer dielectric film to the semiconductor substrate, wherein the lower base structure has a first sidewall underlying the upper base structure and overlying the first dielectric layer, wherein the lower base structure further has a second sidewall laterally offset from the first sidewall and facing and bordering a sidewall of the first dielectric layer, wherein the lower and upper base structures are different semiconductors; and an emitter extending through the upper base structure to the lower base structure. In some embodiments, the multilayer dielectric film is an ONO film, wherein the first dielectric layer includes nitride. In some embodiments, the BJT further includes a sidewall spacer structure laterally separating the emitter from the upper base structure, wherein the second sidewall underlies the sidewall spacer structure. In some embodiments, the first and second sidewalls are ring shaped. In some embodiments, wherein a width of the lower base structure discretely decreases from top to bottom. In some embodiments, the lower base structure has a lower bandgap than the upper base structure. In some embodiments, the emitter and the upper base structure include a polycrystalline semiconductor material.

In some embodiments, the present disclosure provides another BJT including: a semiconductor substrate; a dielectric film overlying the semiconductor substrate; a lower base structure inset into the dielectric film and contacting the semiconductor substrate; an upper base structure overlying the lower base structure and the dielectric film, wherein the upper base structure wraps around a top corner of the dielectric film from a top surface of the dielectric film to a sidewall of the dielectric film, wherein the upper base structure extends along the sidewall of the dielectric film to the lower base structure, and wherein the lower and upper base structures are different semiconductors; and an emitter extending through the upper base structure to the lower base structure. In some embodiments, the lower base structure has a lower bandgap than the upper base structure. In some embodiments, the emitter and the upper base structure include a polycrystalline semiconductor material. In some embodiments, the dielectric film is an ONO film. In some embodiments, the BJT further includes: a sidewall spacer structure laterally separating the emitter from the upper base structure, wherein a bottom surface of the sidewall spacer structure is recessed relative to the top surface of the dielectric film. In some embodiments, a bottom surface of the upper base structure and a bottom surface of the emitter are about even and recessed relative to the top surface of the dielectric film. In some embodiments, the lower base structure has an oblong profile that is curved.

In some embodiments, the present disclosure provides method for forming a BJT, the method including: depositing a film overlying a substrate and including a lower dielectric layer, an upper dielectric layer, and an intermediate dielectric layer between the lower and upper dielectric layers; depositing a first semiconductor layer over the film; patterning the first semiconductor layer to form an opening exposing the film; performing a first etch into the upper dielectric layer through the opening to extend the opening to the intermediate dielectric layer, wherein the first etch stops on the intermediate dielectric layer and laterally undercuts the first semiconductor layer; performing additional etches to extend the opening to the substrate; forming a lower base structure and an emitter stacked in and filling the opening, wherein the lower base structure and the emitter are semiconductors; and patterning the first semiconductor layer to form an upper base structure. In some embodiments, the first etch includes a wet etch. In some embodiments, the forming of the lower base structure includes depositing the lower base structure directly contacting a bottom surface of the first semiconductor layer at a bottom of the opening. In some embodiments, the performing of the additional etches includes: performing a second etch into the intermediate dielectric layer to extend the opening to the lower dielectric layer, wherein the second etch stops on the lower dielectric layer; and performing a third etch into the lower dielectric layer to extend the opening to the substrate, wherein the third etch stops on the substrate; wherein the second and third etches are performed respectively by dry etching and wet etching. In some embodiments, the method further includes forming a doped semiconductor region in the substrate, wherein the doped semiconductor region defines a collector and has a same doping type as the emitter, and wherein the opening is formed overlying the doped semiconductor region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bipolar junction transistor (BJT) comprising:
   a substrate;
   a dielectric film overlying the substrate and comprising a lower dielectric layer, an upper dielectric layer, and an intermediate dielectric layer between the lower and upper dielectric layers;

a lower base structure overlying the intermediate dielectric layer and protruding through the intermediate dielectric layer and the lower dielectric layer to the substrate;
an upper base structure overlying the lower base structure, wherein the lower and upper base structures are different semiconductors and contact at a heterojunction; and
an emitter overlying the upper base structure and extending through the upper base structure to the lower base structure.

2. The BJT according to claim 1, wherein the dielectric film comprises a first dielectric and a second dielectric, and wherein the lower and upper dielectric layers comprise the first dielectric, and wherein the intermediate dielectric layer comprises the second dielectric.

3. The BJT according to claim 1, wherein the lower base structure comprises germanium, and wherein the upper base structure consists essentially of silicon.

4. The BJT according to claim 1, wherein the upper base structure has an outer sidewall facing away from the emitter and an inner sidewall facing the emitter, and wherein a sidewall of the lower base structure overlies the intermediate dielectric layer laterally between and laterally spaced from the inner and outer sidewalls.

5. The BJT according to claim 1, wherein the lower base structure has a T-shaped profile.

6. The BJT according to claim 1, wherein the emitter is a semiconductor and directly contacts the lower base structure at a heterojunction.

7. The BJT according to claim 1, wherein a top surface of the lower base structure and a top surface of the upper dielectric layer are about even.

8. The BJT according to claim 1, wherein the substrate comprises a doped region defining a collector and underlying the lower base structure, and wherein the doped region has an opposite doping type as the lower and upper base structures.

9. A bipolar junction transistor (BJT) comprising:
a semiconductor substrate;
a dielectric film overlying the semiconductor substrate;
a lower base structure inset into the dielectric film and contacting the semiconductor substrate;
an upper base structure overlying the lower base structure and the dielectric film, wherein the upper base structure wraps around a top corner of the dielectric film from a top surface of the dielectric film to a sidewall of the dielectric film, wherein the upper base structure extends along the sidewall of the dielectric film to the lower base structure, and wherein the lower and upper base structures are different semiconductors; and
an emitter extending through the upper base structure to the lower base structure.

10. The BJT according to claim 9, wherein the lower base structure has a lower bandgap than the upper base structure.

11. The BJT according to claim 9, wherein the emitter and the upper base structure comprise a polycrystalline semiconductor material.

12. The BJT according to claim 9, wherein the dielectric film is an oxide-nitride-oxide (ONO) film.

13. The BJT according to claim 9, further comprising:
a sidewall spacer structure laterally separating the emitter from the upper base structure, wherein a bottom surface of the sidewall spacer structure is recessed relative to the top surface of the dielectric film.

14. The BJT according to claim 9, wherein a bottom surface of the upper base structure and a bottom surface of the emitter are about even and recessed relative to the top surface of the dielectric film.

15. The BJT according to claim 9, wherein the lower base structure has an oblong profile that is curved.

16. A method for forming a bipolar junction transistor (BJT), the method comprising:
depositing a film overlying a substrate and comprising a lower dielectric layer, an upper dielectric layer, and an intermediate dielectric layer between the lower and upper dielectric layers;
depositing a first semiconductor layer over the film;
patterning the first semiconductor layer to form an opening exposing the film;
performing a first etch into the upper dielectric layer through the opening to extend the opening to the intermediate dielectric layer, wherein the first etch stops on the intermediate dielectric layer and laterally undercuts the first semiconductor layer;
performing at least one additional etch to extend the opening to the substrate;
forming a lower base structure and an emitter stacked in and filling the opening, wherein the lower base structure and the emitter are semiconductors; and
patterning the first semiconductor layer to form an upper base structure.

17. The method according to claim 16, wherein the first etch comprises a wet etch.

18. The method according to claim 16, wherein the forming of the lower base structure comprises depositing the lower base structure directly contacting a bottom surface of the first semiconductor layer at a bottom of the opening.

19. The method according to claim 16, wherein the performing of the at least one additional etch comprises:
performing a second etch into the intermediate dielectric layer to extend the opening to the lower dielectric layer, wherein the second etch stops on the lower dielectric layer; and
performing a third etch into the lower dielectric layer to extend the opening to the substrate, wherein the third etch stops on the substrate;
wherein the second and third etches are performed respectively by dry etching and wet etching.

20. The method according to claim 16, further comprising:
forming a doped semiconductor region in the substrate, wherein the doped semiconductor region defines a collector and has a same doping type as the emitter, and wherein the opening is formed overlying the doped semiconductor region.

* * * * *